United States Patent
Kanaya et al.

(10) Patent No.: US 9,105,572 B2
(45) Date of Patent: Aug. 11, 2015

(54) MAGNETIC MEMORY AND MANUFACTURING METHOD THEREOF

(71) Applicants: Hiroyuki Kanaya, Seoul (KR); Dong Jun Kim, Suwon-si (KR); Sung Hoon Lee, Icheon-si (KR)

(72) Inventors: Hiroyuki Kanaya, Seoul (KR); Dong Jun Kim, Suwon-si (KR); Sung Hoon Lee, Icheon-si (KR)

( * ) Notice: Subject to any disclaimer, the term of this patent is extended or adjusted under 35 U.S.C. 154(b) by 0 days.

(21) Appl. No.: 14/203,400

(22) Filed: Mar. 10, 2014

(65) Prior Publication Data

US 2015/0069480 A1    Mar. 12, 2015

Related U.S. Application Data

(60) Provisional application No. 61/875,541, filed on Sep. 9, 2013.

(51) Int. Cl.
| | | |
|---|---|---|
| H01L 27/00 | (2006.01) | |
| H01L 27/22 | (2006.01) | |
| H01L 43/12 | (2006.01) | |
| G11C 11/16 | (2006.01) | |
| G11C 7/18 | (2006.01) | |

(52) U.S. Cl.
CPC ............... H01L 27/228 (2013.01); G11C 7/18 (2013.01); G11C 11/16 (2013.01); G11C 11/161 (2013.01); H01L 27/222 (2013.01); H01L 43/12 (2013.01)

(58) Field of Classification Search
CPC ........ G11C 11/16; G11C 11/161; G11C 7/18; H01L 27/228; H01L 27/222
See application file for complete search history.

(56) References Cited

U.S. PATENT DOCUMENTS

| | | | | |
|---|---|---|---|---|
| 7,759,750 | B2* | 7/2010 | Hayakawa et al. | 257/421 |
| 2003/0210586 | A1* | 11/2003 | Nakajima et al. | 365/200 |
| 2006/0067116 | A1* | 3/2006 | Hayakawa et al. | 365/171 |
| 2006/0098480 | A1* | 5/2006 | Bessho | 365/158 |
| 2008/0293165 | A1* | 11/2008 | Ranjan et al. | 438/3 |
| 2008/0308887 | A1* | 12/2008 | Asao et al. | 257/421 |
| 2009/0166773 | A1* | 7/2009 | Ohno et al. | 257/421 |
| 2010/0034014 | A1* | 2/2010 | Ohno et al. | 365/158 |
| 2010/0176472 | A1* | 7/2010 | Shoji | 257/421 |
| 2011/0134689 | A1* | 6/2011 | Hayakawa | 365/171 |
| 2011/0194329 | A1* | 8/2011 | Ohba et al. | 365/148 |
| 2012/0063221 | A1* | 3/2012 | Yamane et al. | 365/173 |
| 2012/0063222 | A1* | 3/2012 | Yamane et al. | 365/173 |
| 2012/0074511 | A1* | 3/2012 | Takahashi et al. | 257/427 |
| 2012/0217476 | A1 | 8/2012 | Ikeno et al. | |
| 2012/0241881 | A1* | 9/2012 | Daibou et al. | 257/421 |
| 2013/0051134 | A1* | 2/2013 | Kawahara et al. | 365/158 |
| 2013/0107616 | A1* | 5/2013 | Ohno et al. | 365/158 |
| 2014/0119106 | A1* | 5/2014 | Lee et al. | 365/158 |
| 2014/0119109 | A1* | 5/2014 | Nagase et al. | 365/158 |
| 2014/0198564 | A1* | 7/2014 | Guo | 365/158 |

(Continued)

FOREIGN PATENT DOCUMENTS

| | | |
|---|---|---|
| JP | 2012-199391 A | 10/2012 |
| JP | 2012-204431 A | 10/2012 |

Primary Examiner — Ngan Ngo
(74) Attorney, Agent, or Firm — Holtz, Holtz, Goodman & Chick PC

(57) ABSTRACT

According to one embodiment, a magnetic memory includes a cell transistor including a first source/drain diffusion layer and a second source/drain diffusion layer, a first contact on the first source/drain diffusion layer, a memory element on the first contact, and a second contact on the second source/drain diffusion layer, the second contact including a first plug on the second source/drain diffusion layer, and a second plug on the first plug.

15 Claims, 9 Drawing Sheets

(56) References Cited

U.S. PATENT DOCUMENTS

| | | | |
|---|---|---|---|
| 2014/0203341 A1* | 7/2014 | Guo | 257/295 |
| 2014/0217487 A1* | 8/2014 | Guo | 257/295 |
| 2014/0254252 A1* | 9/2014 | Guo | 365/158 |
| 2014/0264669 A1* | 9/2014 | Nakayama et al. | 257/421 |
| 2014/0284736 A1* | 9/2014 | Toko et al. | 257/421 |
| 2014/0284737 A1* | 9/2014 | Kumura | 257/421 |
| 2014/0328116 A1* | 11/2014 | Guo | 365/158 |
| 2014/0346624 A1* | 11/2014 | Shoji et al. | 257/421 |

* cited by examiner

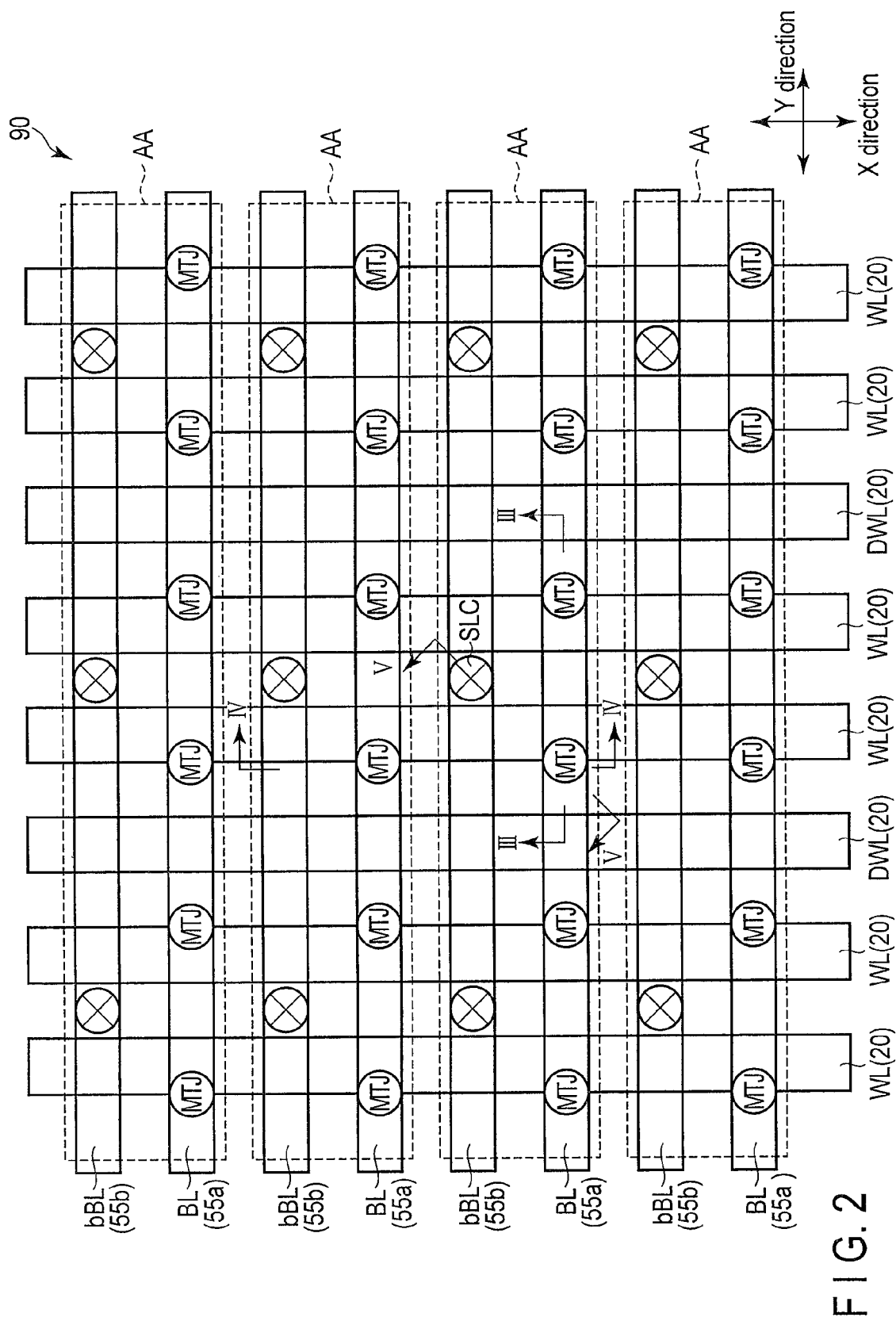
F I G. 2

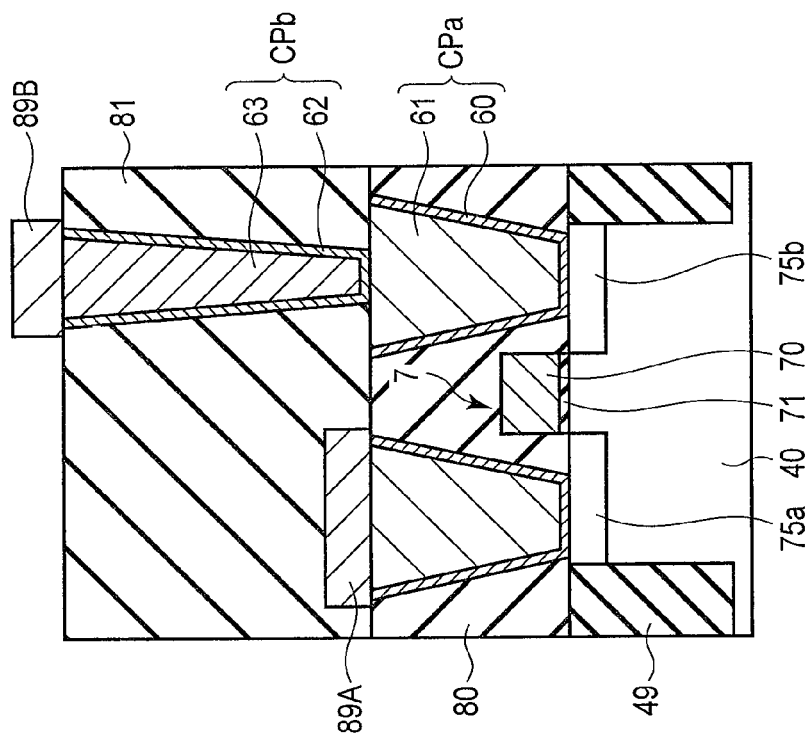
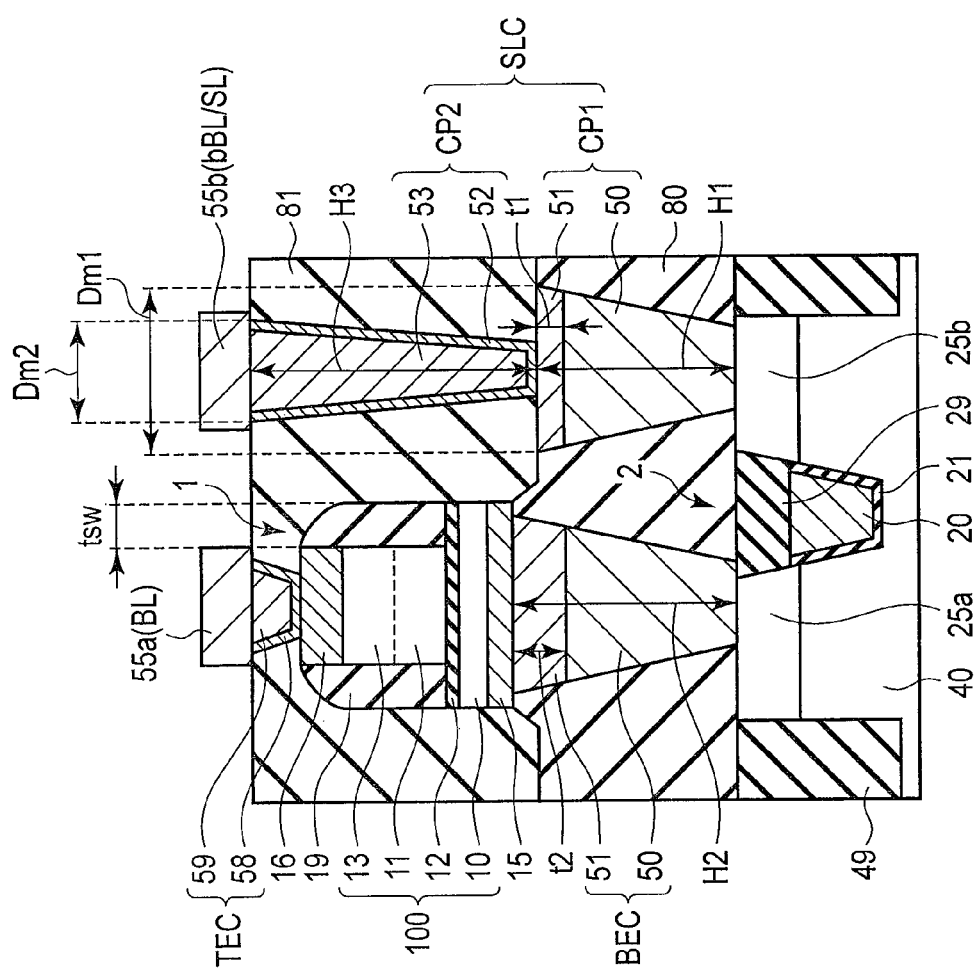
FIG. 5
FIG. 6

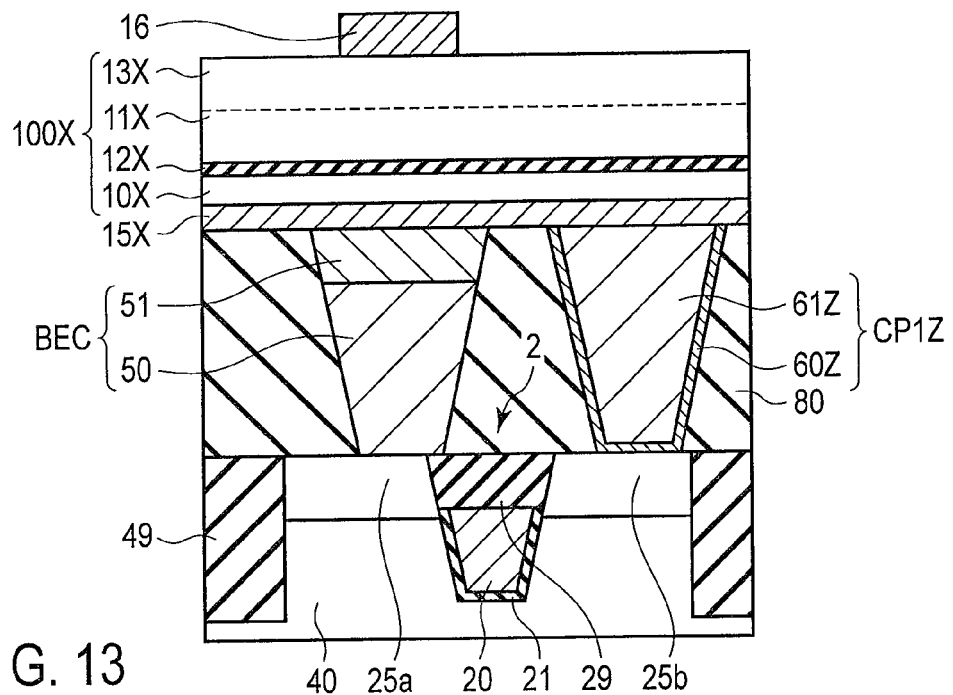
F I G. 13
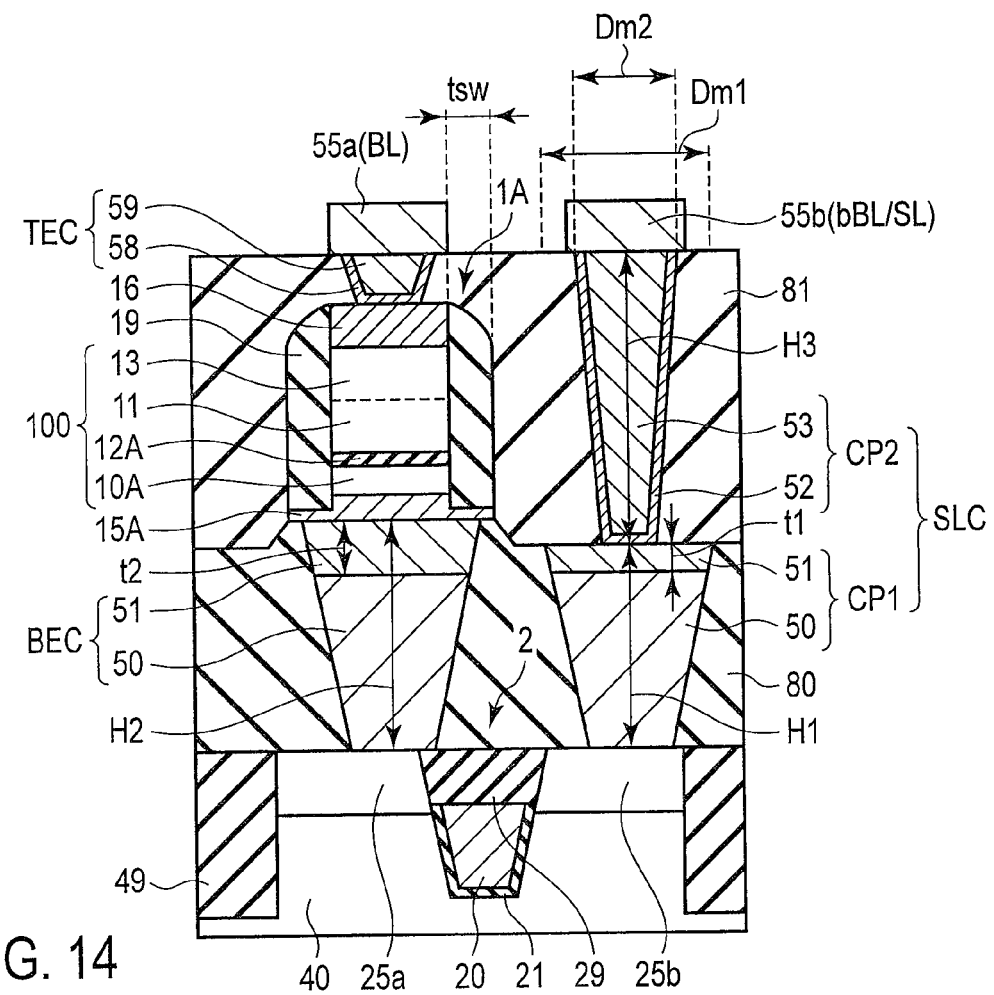
F I G. 14

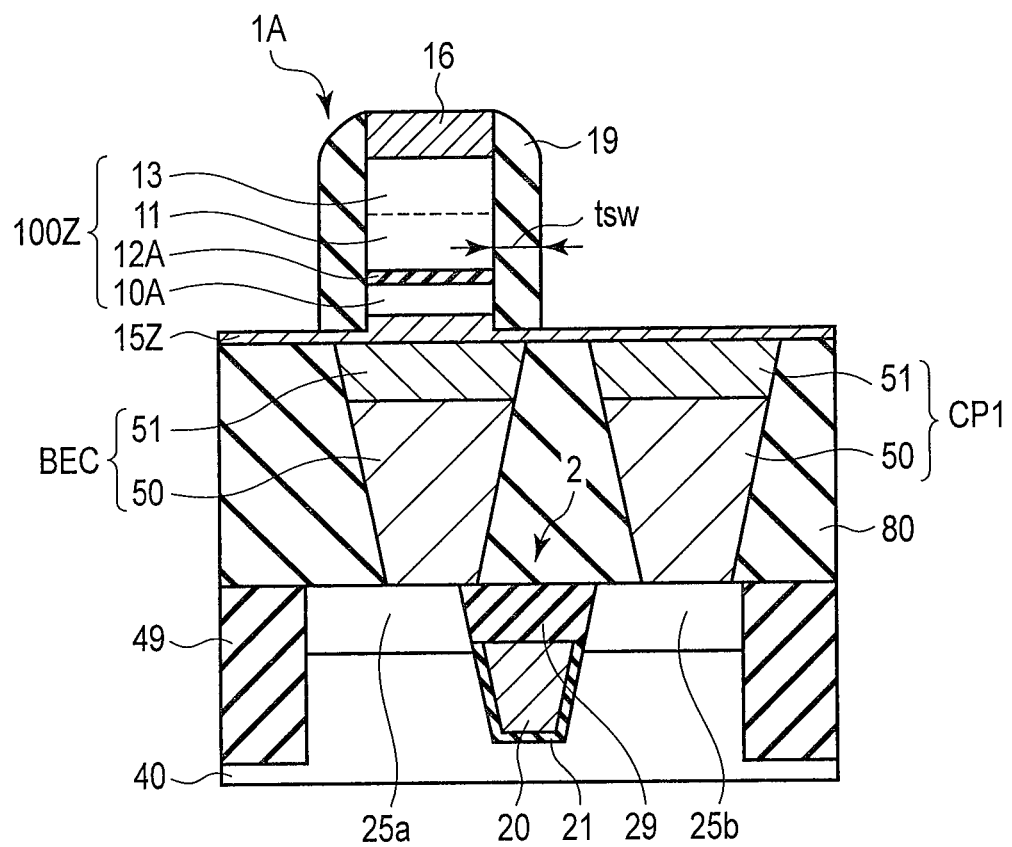
F I G. 15

US 9,105,572 B2

MAGNETIC MEMORY AND MANUFACTURING METHOD THEREOF

CROSS-REFERENCE TO RELATED APPLICATIONS

This application claims the benefit of U.S. Provisional Application No. 61/875,541, filed Sep. 9, 2013, the entire contents of which are incorporated herein by reference.

FIELD

Embodiments described herein relate generally to a magnetic memory and a manufacturing method of the magnetic memory.

BACKGROUND

In recent years, a spin transfer torque-type magnetoresistive random access memory (STT-MRAM) has been proposed as one of semiconductor memories. In the MRAM, a magnetoresistive effect element is included in a memory cell. The magnetoresistive effect element includes two magnetic layers (ferromagnetic layers) and a nonmagnetic layer which is provided between the two magnetic layers. Depending on the magnetization states of the two magnetic layers of the magnetoresistive effect element, that is, depending on whether the spin directions of the two magnetic layers are parallel or antiparallel, "1" or "0" information is stored in the memory cell.

BRIEF DESCRIPTION OF THE DRAWINGS

FIG. 2 is a view illustrating a layout example of a cell array of the magnetic memory.

FIG. 5 is a view illustrating a structure example of a memory cell of a magnetic memory according to a first embodiment.

FIG. 6 is a view illustrating a structure example of a transistor of the magnetic memory.

FIG. 13 is a cross-sectional view illustrating a fabrication step of a manufacturing method of the magnetic memory of the second embodiment.

FIG. 14 is a view illustrating a structure example of a memory cell of a magnetic memory according to a third embodiment.

FIG. 15 is a cross-sectional view illustrating a fabrication step of a manufacturing method of the magnetic memory of the third embodiment.

DETAILED DESCRIPTION

Figure 1:
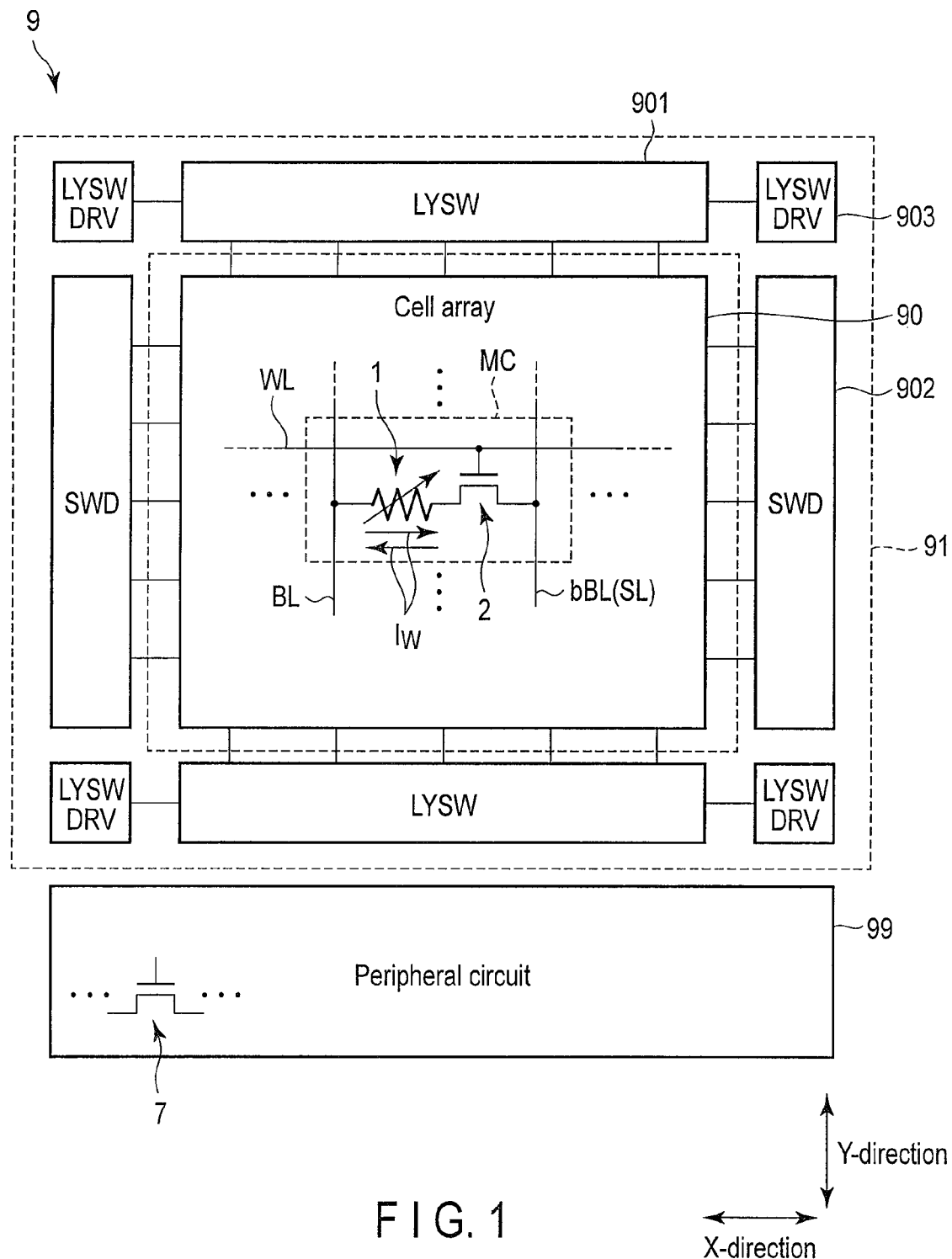
FIG. 1 is a view illustrating a structure example of a magnetic memory.

Various embodiments will be described hereinafter in detail with reference to the accompanying drawings. In the description below, elements having the same functions and structures are denoted by like reference numerals, and an overlapping description will be given only where necessary.

In general, according to one embodiment, a magnetic memory includes: a cell transistor on a semiconductor substrate, the cell transistor including a first source/drain diffusion layer, a second source/drain diffusion layer, a first gate insulation film on a channel region between the first source/drain diffusion layer and the second source/drain diffusion layer, and a first gate electrode on the first gate insulation film; a first contact on the first source/drain diffusion layer of the cell transistor; a magnetoresistive effect element as a memory element on the first contact; a second contact on the second source/drain diffusion layer of the cell transistor, the second contact including a first plug on the second source/drain diffusion layer, and a second plug on the first plug, the second plug neighboring the memory element; a first bit line above the magnetoresistive effect element as the memory element; and a second bit line above the second contact.

EMBODIMENTS

(1) First Embodiment

Referring to FIG. 1 to FIG. 11, a magnetic memory according to a first embodiment will be described.

(a) Structure

The structure of the magnetic memory according to the first embodiment is described with reference to FIG. 1 to FIG. 6.

FIG. 1 is a block diagram illustrating the whole structure of the magnetic memory according to the first embodiment.

As shown in FIG. 1, the magnetic memory includes a cell array 90, a core circuit 91 and a peripheral circuit 99. The magnetic memory of this embodiment is, for example, a magnetoresistive RAM (MRAM).

The cell array 90 includes a plurality of memory cells MC. The memory cells MC are arranged in a matrix in the cell array 90. Data is stored in each memory cell.

The memory cell MC of the MRAM includes, for example, one magnetoresistive effect element as a memory element 1, and a cell transistor (e.g. a field-effect transistor with a buried gate structure) 2 as one select element.

Two bit lines BL and bBL and one word line WL are connected to the memory cell MC. One end of the magnetoresistive effect element 1 is connected to one bit line BL, the other end of the magnetoresistive effect element 1 is connected to one end (source/drain) of a current path of the cell transistor 2, and the other end (drain/source) of the current path of the cell transistor 2 is connected to the other bit line bBL. A control terminal (gate) of the cell transistor 2 is connected to the word line WL. The bit lines BL and bBL extend in a Y direction (column direction), and the word line WL extends in an X direction (row direction).

In the case where the MRAM of the embodiment is a spin transfer torque (STT)-type MRAM, a write current Iw is supplied in the magnetoresistive effect element 1 at a time of writing data to the memory cell.

The core circuit 91 is electrically connected to the cell array 90. Data is transferred between the core circuit 91 and the cell array 90. The core circuit 91 includes a local column switch circuit (LYSW) 901, a sub-word line decoder (SWD) 902, and a local column switch driver (LYSWDRV) 903.

The local column switch circuit 901 selectively connects the bit line BL, bBL and a global bit line (not shown) in accordance with a supplied column address in a magnetic memory in which a hierarchical bit line scheme is adopted. After receiving a row address, the sub-word line decoder 902 decodes the received row address. The local column switch driver 903 controls ON/OFF of local column switches of the local column switch circuit 901.

For example, the local column switch circuit 901 includes a transistor with a buried gate electrode, the sub-word line decoder 902 includes a planar-type transistor, and the local column switch driver 903 includes both the buried gate-type transistor and the planar-type transistor.

The peripheral circuit 99 is electrically connected to the cell array 90 via the core circuit 91. The peripheral circuit 99 includes, for example, a control circuit which controls the core circuit 91 and cell array 90, a voltage generation circuit, and a current generation circuit. For example, a planar-type field-effect transistor 7 is provided in the peripheral circuit 99.

The cell array 90, core circuit 91 and peripheral circuit 99 are formed on the same semiconductor substrate 41.

Figure 3:
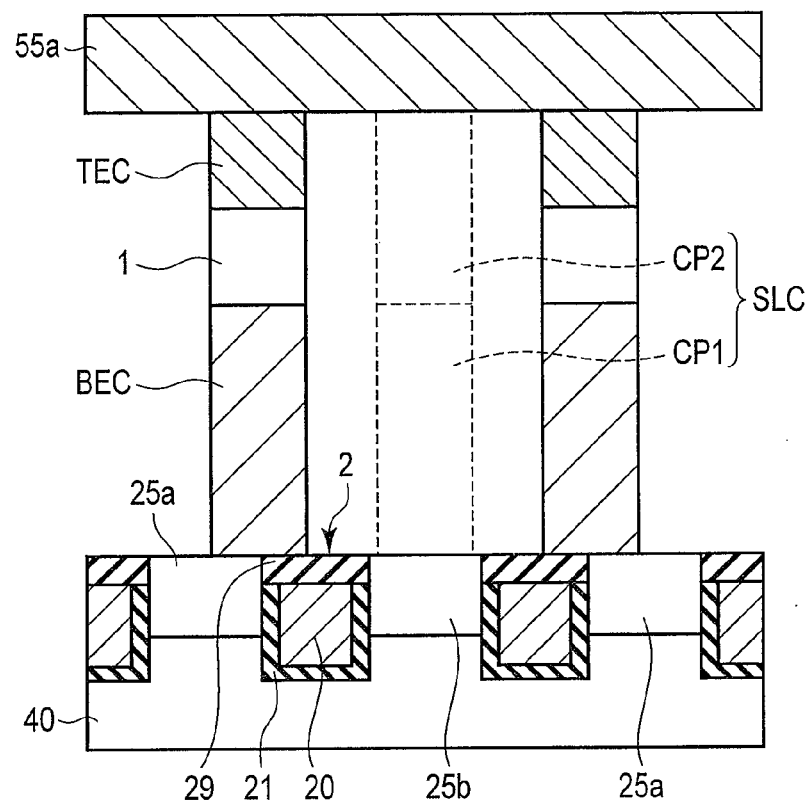
FIG. 3 is a view which schematically illustrates a cross-sectional structure of the cell array of the magnetic memory.
Figure 4:
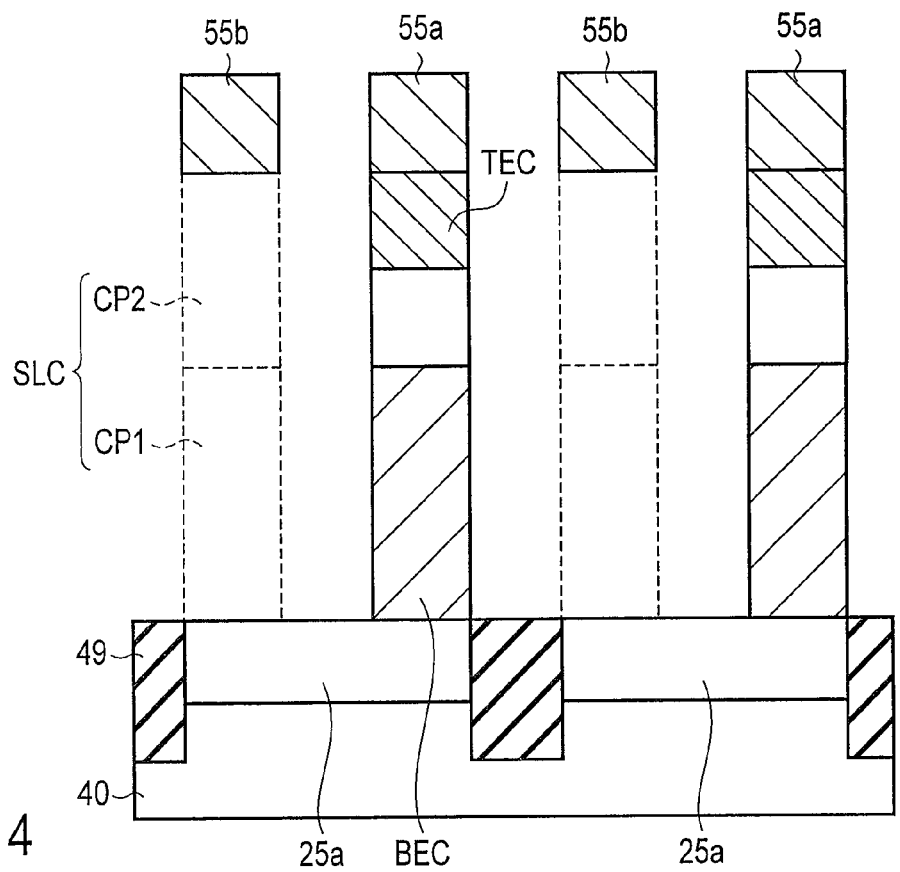
FIG. 4 is a view which schematically illustrates a cross-sectional structure of the cell array of the magnetic memory.

Referring to FIG. 2 to FIG. 4, the structure of the cell array of the MRAM of the embodiment is described.

FIG. 2 is a plan view illustrating the cell array 90 of the MRAM of the embodiment. FIG. 3 schematically shows a cross section along line in FIG. 2. FIG. 4 schematically shows a cross section along line IV-IV in FIG. 2. In FIG. 3 and FIG. 4, members, which are located on the background (or foreground) in the Figures, are indicated by broken lines. In addition, in FIG. 3 and FIG. 4, depiction of interlayer insulation films on the semiconductor substrate is omitted for the purpose of clearer depiction.

For example, in the cell array 90, a plurality of word lines WL and a plurality of dummy word lines DWL, which extend in the X direction, and a plurality of bit lines BL and bBL (SL), which extend in the Y direction, are arranged. Two word lines WL and one dummy word line DWL are alternately arranged in the Y direction.

As illustrated in FIG. 2 to FIG. 4, in the cell array 90, device isolation regions, which extend in the Y direction, are provided in a surface region of a p-type semiconductor substrate (e.g. silicon substrate) 40. Device isolation insulation layers 49 are provided in the device isolation regions. Those parts of the surface region of the semiconductor substrate 40, in which the device isolation insulation layers 49 are not provided, become active areas AA. The device isolation regions and active areas AA are alternately arranged in the X direction. The device isolation insulation layer 49 has, for example, a shallow trench isolation (STI) structure. An insulative material with a high burying characteristic, such as silicon nitride (SiN), is used for the device isolation insulation layer 49.

The cell transistor 2 is provided on the semiconductor substrate 40. The cell transistor 2 is, for example, an n-channel type MOS transistor.

The cell transistor 2 includes a gate electrode 20 which is buried in a recess in the semiconductor substrate 40. A gate insulation film 21 is provided between the semiconductor substrate 40 and the gate electrode 20. In the description below, the gate structure, which is buried in the semiconductor substrate, is referred to as "buried gate structure".

The gate insulation film 21 is formed on an inner surface of the recess. The gate electrode 20 is formed on the inner surface of the gate insulation film 21 so as to fill a lower side part of the recess. The gate electrode 20 is formed so as to extend in the X direction. The gate electrode 20 is used as the word line WL. The gate electrode 20, which is buried in the recess, includes, for example, polysilicon, a barrier metal (e.g. titanium nitride), or tungsten (W).

An insulation film 29, which is formed of, e.g. SiN, is provided on upper surfaces of the gate insulation film 21 and gate electrode 20 so as to fill an upper side part of the recess. The upper surface of the insulation film 29 is substantially on a level with the upper surface of the semiconductor substrate 40.

A diffusion layer (hereinafter referred to as "source/drain diffusion layer") 25a, 25b, which functions as a source/drain of the cell transistor 2, is formed such that the gate insulation film 21, gate electrode 20 and insulation film 29 are interposed between source/drain diffusion layers 25a, 25b. The source/drain diffusion layer 25b of the cell transistors 2 of two memory cells, which neighbor in the Y direction, are shared by the two memory cells which neighbor in the Y direction. The source/drain diffusion layer 25b, which is shared by the two cell transistors 2, is a source/drain diffusion layer which is connected to the bit line bBL which is on the low potential side at a time of data read.

A semiconductor region along the recess between the source/drain diffusion layers 25a and 25b becomes a channel region of the cell transistor (buried gate-type transistor) 2.

Incidentally, the cell transistor 2 may be a planar-type transistor.

As illustrated in FIG. 4, the source/drain diffusion layers 25a, 25b are isolated by the device isolation region (device isolation insulation layer 49) in the X direction.

In the meantime, of the three gate electrodes 20 neighboring in the Y direction, two gate electrodes 20 correspond to word lines WL which are connected to the memory cells, and the other gate electrode 20 corresponds to the dummy word line DWL. The neighboring memory cells MC are electrically isolated by the control of the potential of the dummy word line DWL.

An interlayer insulation film (not shown) is provided on the semiconductor substrate 40. Contact plugs BEC and SLC are provided in the interlayer insulation film such that the contact plugs BEC and SLC are connected to the source/drain diffusion layers 25a and 25b of the cell transistors 2.

The magnetoresistive effect element 1 is provided on the contact plug BEC, and a lower electrode of the magnetoresistive effect element 1 is connected to the contact plug BEC. The contact plug BEC includes, for example, tantalum and titanium nitride. A wiring 55a serving as the bit line BL is provided on an upper electrode of the magnetoresistive effect element 1 via a via-plug TEC.

The contact plug SLC is provided in the interlayer insulation film, and a wiring 55b serving as the bit line bBL is connected to the source/drain diffusion layer 25b of the cell transistor 2 by the contact plug SLC.

In the present embodiment, two bit lines BL and bBL, which constitute a bit line pair, are provided on the same wiring level, but the embodiment is not limited to this example.

In this embodiment, the lower electrode and the upper electrode, which are connected to the magnetoresistive effect element 1, are described as parts of the structural elements of the magnetoresistive effect element, but the embodiment is not limited to this example.

In the MRAM of the embodiment, as illustrated in FIG. 3 and FIG. 4, of the contact plugs between the source/drain diffusion layers 25a, 25b of the cell transistors 2 and the bit lines BL, bBL, the contact plug SLC, which is not directly connected to the magnetoresistive effect element 1, includes two plugs CP1 and CP2. The two plugs CP1 and CP2 are directly connected to each other.

In the embodiment, of the two bit lines which constitute a bit line pair, the bit line, which is set on a low potential side at the time of data read of the MRAM, is referred as "source line SL". The contact plug SLC, which connects the bit line bBL that functions as the source line SL, and the source/drain diffusion layer 25b of the cell transistor 2, is referred to as "source line-side contact SLC". In the description below, for the purpose of clear description, the contact plug TEC, BEC, between the bit line BL and the source/drain diffusion layer 25a of the cell transistor 2, is referred to as "bit line-side contact TEC, BEC". The bit line-side contact TEC, BEC is put in direct contact with the magnetoresistive effect element 1.

Referring now to FIG. 5, a more concrete description is given of the structure of the memory cell of the MRAM of the embodiment.

FIG. 5 is a cross-sectional view illustrating a cross-sectional structure of the magnetoresistive effect element of the MRAM of the embodiment. FIG. 5 is a cross-sectional view taken along line V-V in FIG. 2. FIG. 5 is a cross-sectional view of the memory cell in an oblique direction to the row direction and column direction in a parallel direction to the surface of the semiconductor substrate.

FIG. 6 is a cross-sectional view illustrating the structure of a transistor with a planar configuration (hereinafter referred to as "peripheral transistor") which is included in the core circuit or peripheral circuit in the MRAM.

As illustrated in FIG. 5 and FIG. 6, the cell transistor 2 and peripheral transistor 7 of the MRAM are provided on the common semiconductor substrate (chip) 40.

The cell transistor 2, as described above, is a transistor with a buried gate structure. The cell transistor 2 includes a gate insulation film 21 in the recess in the semiconductor substrate 40, a gate electrode 20 buried in the recess via the gate insulation film 21, and a source/drain diffusion layer 25a, 25b in the semiconductor substrate 40.

As illustrated in FIG. 6, the peripheral transistor 7 is a transistor with a planar structure. The peripheral transistor 7 includes a gate insulation film 71 on the semiconductor substrate 40, a gate electrode 70 on the gate insulation film 71, and a source/drain diffusion layer 75a, 75b in the semiconductor substrate 40. A wiring 89A, 89B is connected to the source/drain diffusion layer 75a, 75b of the peripheral transistor 7 via a contact plug CPa, CPb. The plug CPa, CPb of the peripheral transistor 7 includes, for example, a multilayer film including a titanium nitride film 60, 62, which functions as a barrier metal, and a tungsten film (or a titanium film) 61, 63.

As illustrated in FIG. 5, the magnetoresistive effect element 1 includes a first magnetic layer 10, a second magnetic layer 11, and a nonmagnetic layer 12 between the two magnetic layers 10 and 11. A multilayer structure 100 including the two magnetic layers 10 and 11 and the nonmagnetic layer 12 constitutes a magnetic tunnel junction 100. In the description below, the magnetoresistive effect element 1 including the magnetic tunnel junction 100 is also referred to as "MTJ element 1".

In the MTJ element 1, the nonmagnetic layer 12 is formed of an insulator. In the description below, the nonmagnetic layer 12 formed of the insulator is referred to as "tunnel barrier layer 12".

The direction of magnetization of one of the two magnetic layers 10 and 11 of the MTJ element 1 is variable, and the direction of magnetization of the other magnetic layer is invariable (fixed state). In the description below, the magnetic layer, which has a variable direction of magnetization, is referred to as "memory layer (storage layer)", and the magnetic layer, which has an invariable direction of magnetization, is referred to as "reference layer".

That the direction of magnetization of the magnetic layer is variable means that the direction of magnetization of the magnetic layer is varied by a predetermined write current Iw which is supplied to the MTJ element at a time of writing data in the memory cell. That the direction of magnetization of the magnetic layer is invariable means that the direction of magnetization of the magnetic layer is not varied by the predetermined write current Iw. Specifically, the reference layer has a greater magnetization reversal threshold (a magnetization direction reversal energy barrier) than the memory layer.

In the data write of the STT-MRAM, a write current Iw, which flows in a direction perpendicular to the film surface of the magnetic layer 10, 11, flows in the MTJ element 1 which functions as the memory element. The direction of the write current Iw is varied in accordance with data that is to be written.

When the write current IW flows from the memory layer to the reference layer, the electrons of the write current Iw move from the reference layer toward the memory layer. In this case, the electrons, which are spin-polarized in the same direction as the direction of magnetization of the reference layer, are injected in the memory layer. A spin angular momentum of the spin-polarized electrons is applied to the spin which forms the magnetization of the memory layer. Thereby, the direction of magnetization of the memory layer is set to be the same as the direction of magnetization of the reference layer, and the direction of magnetization of the reference layer and the direction of magnetization of the memory layer are oriented in parallel.

When the orientation of magnetization of the reference layer and memory layer is parallel orientation, the resistance value of the MTJ element 1 is lowest. For example, data "0" is assigned to the low resistance state of the MTJ element 1.

On the other hand, when the write current Iw flows from the reference layer to the memory layer, the electrons of the write current Iw move from the memory layer toward reference layer. In this case, the electrons in a direction opposite to the direction of magnetization of the reference layer, which are reflected by the reference layer, are injected in the memory layer as spin-polarized electrons. An angular momentum of the spin-polarized electrons (electrons reflected by the reference layer) is applied to the spin of the memory layer, and the direction of magnetization of the memory layer is set to be opposite to the direction of magnetization of the reference layer. Thereby, the direction of magnetization of the reference layer and the direction of magnetization of the memory layer are oriented to be antiparallel.

When the orientation of magnetization of the reference layer and memory layer is antiparallel orientation, the resistance value of the MTJ element is highest. For example, data "1" is assigned to the high resistance state of the MTJ element 1.

In addition, data read of the STT-MRAM is executed by supplying a read current, which has a smaller current value than the write current Iw, into the MTJ element 1. The read current is set at such a magnitude that no reversal occurs in the magnetization direction of the memory layer. A variation of the potential/current value of the bit line BL, bBL, which corresponds to the resistance value of the MTJ element at a time when the read current has been supplied to the MTJ element 1, is detected, and thereby the data "0" and "1" of the MTJ element in the memory cell can be discriminated.

In the example illustrated in FIG. 5, the reference layer 11 is stacked on the memory layer 10 via the tunnel barrier layer 12. The tunnel barrier layer 12 is provided on the memory layer 10. The MTJ element of the embodiment has a top pin structure (also referred to as "bottom free structure") in which the reference layer 11 is provided on the upper side of the MTJ element. However, the MTJ element of the embodiment may have a bottom pin structure (also referred to as "top free structure") in which the reference layer 11 is provided on the bottom side of the MTJ element.

The reference layer 11 and memory layer 10 are formed of ferromagnetic layers or artificial lattices. For example, a single-layer structure or a multilayer structure (artificial lattice) of a magnetic material including cobalt (e.g. CoFeB, CoPt), or a ferrimagnetic material (e.g. TbCoFe) is used for the reference layer 11 and memory layer 10. Mutually different materials may be used for the reference layer 11 and memory layer 10. A film consisting mainly of magnesium oxide (MgO) is used for the tunnel barrier layer 12. For example, there is a case in which an MgO film including aluminum (Al) is used for the tunnel barrier layer 12.

For example, the reference layer 11 and memory layer 10 have such a vertical magnetic anisotropy that the direction of magnetization is perpendicular or substantially perpendicular to the film surface (upper surface/lower surface) of each layer. In this context, "substantially perpendicular" means that the residual magnetization direction of the magnetic layer is in a range of $45°<\theta\leq90°$, relative to the film surface of the magnetic layer. Incidentally, the reference layer 11 and memory layer 10 may have such an in-plane magnetic anisotropy that the direction of magnetization is horizontal (or substantially horizontal) to the film surface of each layer.

For example, a shift control layer 13 is provided between the reference layer 11 and an upper electrode 16. The shift control layer 13 has a vertical magnetic anisotropy. The direction of magnetization of the shift control layer 13 is opposite to the direction of magnetization of the reference layer 11. By the magnetization of the shift control layer 13, an offset of a magnetization reversal characteristic of the memory layer 10 due to a leak magnetic field of the reference layer 11, can be adjusted in the opposite direction. Thereby, a shift magnetic field of the memory layer 10 can be canceled.

In the embodiment, the shift control layer 13 is described as a part of the multilayer structure 100. Incidentally, the shift control layer 13 may be provided adjacent to the memory layer 10. Alternatively, the shift control layer 13 may not be provided.

A functional layer, which is called "interface layer", may be provided in the vicinity of an interface between the magnetic layer 10, 11 and tunnel barrier layer 12 in the MTJ element 1, as a part of the memory layer 10 and reference layer 11, or as a structure different from the memory layer 10 and reference layer 11.

In the embodiment, the dimension of the reference layer 11 in a parallel direction to the surface of the semiconductor substrate 40 is less than the dimension of the memory layer 10 and tunnel barrier layer 12 in the parallel direction to the surface of the semiconductor substrate 40. In this case, the MTJ element 1 has an upwardly convex cross-sectional shape. The plan-view shape of the MTJ element 1 is, for example, circular or elliptic.

The dimension (maximum dimension) of the reference layer 10 in a parallel direction to the surface of the semiconductor substrate is set in a range of, e.g. about 10 nm to 40 nm. Incidentally, the film thickness of the reference layer 11 is set to be sufficiently greater than the film thickness of the memory layer 10, so that the magnetization reversal threshold of the reference layer 11 may become greater than the magnetization reversal threshold of the memory layer 10. For example, the height of the MTJ 1 including a lower electrode 15 and upper electrode 16 is, for example, about 50 nm to 70 nm. However, the height of the MTJ element may be less than 50 nm or may be greater than 70 nm.

For example, an insulation film (hereinafter referred to as "side wall insulation film") 19 is provided on side surfaces of the reference layer 11 and shift control layer 13. The side wall insulation film 19 may cover a side surface of the upper electrode 16. The side wall insulation film 19 includes at least one film selected from among a silicon nitride film, a silicon oxide film and an aluminum oxide (alumina) film. It is preferable that the side wall insulation film 19 be formed conformal, in order to protect the magnetic layers from impurities (e.g. oxygen, moisture). It is preferable that the side wall insulation film 19 have a large film thickness tsw. For example, it is preferable that the side wall insulation film 19 have a film thickness tsw of 5 nm or more. In the embodiment, the side wall insulation film 19 having a film thickness tsw of about 6 nm to 12 nm is provided on the side surface of the MTJ element 1.

The lower electrode 15 is provided on the bottom part of the multilayer structure 100 which forms the magnetic tunnel junction of the MTJ element 1, and the upper electrode 16 is provided on the upper part of the multilayer structure 100.

The lower electrode 15 is provided on the contact plug BEC. In the case where the magnetic layer 10 has magnetocrystalline anisotropy, it is preferable that the lower electrode 15 function as an underlayer (a lattice matching film or a buffer layer) for promoting crystal growth of the magnetic layer 10 which is in contact with the lower electrode 15. In this case, the material, which is used for the lower electrode 15, is selected in accordance with the material that is used for the magnetic layer 10.

The upper electrode 16 is provided on the magnetic tunnel junction (the shift control layer 13 in this embodiment). The upper electrode 16 is used as a hard mask for processing the magnetic layers 10, 11 and 13 and nonmagnetic layer 12 at a time of forming the MTJ element. Thus, in the cell array 90, the upper electrode 16 is provided so as to correspond to each of the MTJ elements 1, and the upper electrode 16 is independent in association with each MTJ element 1. In addition, the upper electrode 16 has a shape corresponding to the shape of the magnetic layers (in this example, the reference layer and shift control layer) that are to be processed, for example, a columnar shape or an elliptic cylindrical shape.

As the material of the upper electrode 16, for example, use is made of a single layer film of at least one material selected from among tungsten (W), tantalum (Ta), titanium (Ti) and titanium nitride (TiN), or a multilayer formed of a combination of these materials.

A contact plug (hereinafter also referred to as "lower plug") BEC, which is connected to the MTJ element 1, is provided in an interlayer insulation film 80. The contact plug BEC is provided between the MTJ element 1 and the source/drain diffusion layer 25a of the cell transistor 2. For example, the contact plug BEC has a tapered cross-sectional shape. In the tapered contact plug BEC, the dimension on the upper surface side (MTJ element 1 side) of the contact plug BEC in the parallel direction to the surface of the semiconductor substrate 40 is greater than the dimension on the bottom surface side (semiconductor substrate 40 side) of the contact plug BEC in the parallel direction to the surface of the semiconductor substrate 40. The contact plug BEC has a circular (or elliptic) plan-view shape.

The contact plug BEC has, for example, a multilayer structure of a titanium nitride film (TiN film) 50 and a tantalum film (Ta film) 51. The titanium nitride film 50 is provided on the semiconductor substrate 40 and is put in directly contact with the source/drain diffusion layer 25a of the transistor 2. The tantalum film 51 is provided on the upper surface of the titanium nitride film 51 and is put in directly contact with the MTJ element 1. The tantalum film 51 is provided between the lower electrode 15 of the MTJ element 1 and the titanium nitride film 51 of the plug BEC, and is put in direct contact with the lower electrode 15. When the lower electrode 15 is not provided, the tantalum film 51 of the contact plug BEC is put in directly contact with the magnetic layer 10 of the MTJ element 1. A part of the bottom surface of the contact plug BEC may be provided on the insulation layer 29 on the upper surface of the gate electrode 20 of the cell transistor 2. A film thickness t2 of the Ta film 51 of the contact plug BEC is, for example, about 20 nm to 50 nm.

A via-plug TEC is provided on the upper electrode 16 of the MTJ element 1. The via-plug TEC is buried in a contact hole in the interlayer insulation film 81. The via-plug TEC includes, for example, a titanium nitride film 58 which functions as a barrier metal, and a tungsten (W) film on the titanium nitride film 88. Incidentally, instead of the tungsten film, a titanium film or a molybdenum film may be used for the via-plug TEC. It is preferable that a formation step (e.g. deposition of a film) of the via-plug TEC, which is performed after the formation of the MTJ element, be performed at temperatures of 300° C. or below, so as not to deteriorate various characteristics of the MTJ element 1.

A wiring (bit line) 55a on the interlayer insulation film 81 is connected to the MTJ element 1 via the via-plug TEC. A damascene-structured copper (Cu) wiring or an aluminum (Al) wiring is used for the bit line 55a.

The source line-side contact SLC connects a source line 55b (SL) on the interlayer insulation film 81 to the source/drain diffusion layer 25b of the cell transistor 2.

The source line-side contact SLC includes a first plug CP1 provided in the interlayer insulation film 80, and a second plug CP2 provided in the interlayer insulation film 81.

The first plug (hereinafter referred to as "lower plug) CP1 on the lower side of the source line-side contact SLC is formed substantially at the same time as the contact plug (bit line-side plug) BEC which is connected to the MTJ element 1, and includes the same material as the contact plug BEC. The lower plug CP1 includes a multilayer structure of a titanium nitride film (TiN film) 50 and a tantalum film (Ta film) 51. The titanium nitride film 50 is provided on the semiconductor substrate 40, and is put in directly contact with the source/drain diffusion layer 25b of the transistor 2. The tantalum film 51 is provided on the upper surface of the titanium nitride film 51. The titanium nitride film 50 is filled in a lower part of a contact hole in the interlayer insulation film 80, and the tantalum film 50 is filled in an upper part of the contact hole in the interlayer insulation film 80.

The upper surface of the lower plug CP1 is located more on the semiconductor substrate 40 side than the upper surface of the contact plug BEC. For example, the upper surface of the interlayer insulation film 80 in the vicinity of the lower plug CP1 retreats more on the semiconductor substrate side than the upper surface of the interlayer insulation film 80 at the part immediately below the MTJ element 1.

A dimension (height) H1 of the lower plug CP1 in a perpendicular direction to the surface of the semiconductor substrate 40 is less than a dimension (height) H2 of the contact plug BEC in the perpendicular direction to the surface of the semiconductor substrate 40.

A film thickness t1 of the tantalum film 51 of the lower plug CP1 is less than the film thickness t2 of the tantalum film 51 of the contact plug BEC. For example, the film thickness t1 of the Ta film 51 of the lower plug CP1 is, e.g. about 3 nm to 30 nm. Film thicknesses (H1-t1) and (H2-t2) of the titanium nitride films 50 in the plug CP1 and BEC are substantially equal.

For example, the lower plug CP1 has a tapered cross-sectional shape. In the tapered lower plug CP1, the dimension on the upper surface side of the lower plug CP1 in the parallel direction to the surface of the semiconductor substrate 40 is greater than the dimension on the bottom surface side (semiconductor substrate 40 side) of the lower plug CP1 in the parallel direction to the surface of the semiconductor substrate 40.

In the present embodiment, since the MTJ element is formed after the peripheral transistor 7 is formed, the height of the contact plug CPa of the peripheral transistor 7 is equal to the height of the lower plug CP1, or is less than the height of the lower plug CP1. The heights of the contact plug CPa and lower plug CP1 vary depending on fabrication steps of the plugs CPa and CP1. In the embodiment, for example, the height of the contact plug CPa of the peripheral transistor 7 is equal to the height of the lower plug CP1.

In the source line-side contact SLC, the second plug (hereafter referred to as "upper plug") CP2 in the interlayer insulation film 81 is stacked on the lower plug CP1 in the interlayer insulation film 80. The upper plug CP2 of the source line-side contact SLC is provided in the same wiring level (interlayer insulation film 81) as the MTJ element 1, and neighbors the MTJ element 1 with a certain distance in the parallel direction (an oblique direction to the row direction and column direction) to the surface of the semiconductor substrate 40.

The upper plug CP2 in the source line-side contact SLC is formed by using a material which is different from the material of the lower plug CP1. For example, the upper plug CP2 includes a multilayer structure of a titanium nitride film 52 and a tungsten film 53. It is preferable that a formation step (e.g. deposition of material) of the upper plug CP2 be performed at temperatures of 300° C. or below, so as not to deteriorate various characteristics of the MTJ element 1.

For example, the upper plug CP2 has a tapered cross-sectional shape. In the tapered lower plug CP2, the dimension on the upper surface side of the upper plug CP2 in the parallel direction to the surface of the semiconductor substrate 40 is greater than the dimension on the bottom surface side (semiconductor substrate 40 side) of the upper plug CP2 in the parallel direction to the surface of the semiconductor substrate 40.

The dimension (height) of the upper plug CP2 in the perpendicular direction to the surface of the semiconductor substrate is greater than, for example, the dimension of the MTJ element 1 in the perpendicular direction to the surface of the semiconductor substrate. A dimension Dm2 of the upper part of the upper plug CP2 in the parallel direction to the surface of the semiconductor substrate 40 is equal to or less than a dimension Dm1 of the upper part of the lower plug CP1. For example, the aspect ratio of the upper plug CP2 is about 3 to 5.

A wiring (source line) 55b on the interlayer insulation film 81 is provided on the upper plug CP2. Thereby, the source line-side contact SLC, which includes the two plugs CP1 and CP2, connects the source/drain diffusion layer 25b of the cell transistor 2 to the source line SL (bit line bBL).

In the meantime, each plug BEC, TEC, CP1, CP2, CPa, CPb has a circular (or elliptic) plan-view shape.

For example, the lower-side contact plug CPa of the peripheral transistor 7 is formed in a fabrication step which is different from a fabrication step of the plug CP1, BEC of the cell transistor. For example, the contact plug CPa of the peripheral transistor is formed in a fabrication step which is prior to the fabrication step of the plug CP1, BEC of the cell transistor 2. The peripheral transistor 7 is a structural element which is provided in the peripheral region. Thus, in order to improve a yield margin of contacts, the contact plug CPa of the peripheral transistor 7 is greater in dimension and smaller in aspect ratio than the contact plug CP1, BEC in the memory cell.

For example, the upper-side plug (via-plug) CPb of the peripheral transistor 7 is formed in a fabrication step which is different from a fabrication step of the via-plug TEC on the MTJ element 1 and the upper plug CP2 of the source line-side contact SLC. The via-plug CPb is formed in a fabrication step after the fabrication step of the via-plug TEC and the upper plug CP2. It is preferable that the plugs TEC, CPb and CP2, which are formed after the processing of the MTJ element 1, be formed under a temperature condition of 300° C. or below, so as not to deteriorate various characteristics of the MTJ element 1.

In the MRAM of the embodiment, the contact plug (source line-side contact) SLC, which is connected to the source line (the bit line that is set on the low potential side at a time of data read) bBL of the memory cell MC, is the multilayer structure of two plugs CP1 and CP2.

Thereby, according to the MRAM of the embodiment, it is possible to relax a high aspect ratio of the contact SLC which is connected to the source line (bit line) SL (bBL), compared to the case where the source line-side contact is formed of a single contact which penetrates the two interlayer insulation films 80 and 81.

According to the MRAM of the present embodiment, by the source line-side contact SLC of the two-stage structure including the multilayer structure of the two plugs CP1 and CP2, the dimension (width) of the source line-side contact SLC in the parallel direction to the surface of the semiconductor substrate can be reduced, and the distance between the MTJ element 1 and that part (upper plug) CP2 of the contact plug SLC, which neighbors the MTJ element 1, can be increased in the parallel direction to the surface of the semiconductor substrate 40. For example, in the embodiment, a distance of about 10 nm (a minimum distance between the MTJ element 1 and the contact SLC in the parallel direction to the surface of the semiconductor substrate) can be secured between the MTJ element 1 and the source line-side contact SLC (upper plug CP2).

As a result, according to the embodiment, the film thickness of the side wall insulation film 19 on the side surface of the MTJ element 1 can be increased.

In the MRAM of the embodiment, since the film thickness of the side wall insulation film 19 of the MTJ 1 can be increased, even if electrically conductive flying matter, which has occurred during processing of a conductive layer (e.g. magnetic layer or lower electrode), has deposited on the side surface of the MTJ element 1 as adhering matter, it is possible to prevent the occurrence of short-circuit between the lower electrode 15 and upper electrode 16 due to the adhering matter.

According to the MRAM of the embodiment, since the distance between the source line-side contact SLC and the MTJ element 1 can be increased, even if the film thickness of the side wall insulation film 19 increases, it is possible to prevent the occurrence of short-circuit between the conductive adhering matter on the side surface of the side wall insulation film 19 and the source line-side contact SLC. Since the distance between the source line-side contact SLC and the MTJ element 1 can be increased, the MRAM of the embodiment can reduce mutual interference or parasitic capacitance between the source line-side contact SLC and the MTJ element.

According to the embodiment, it is possible to prevent the size of the memory cell (the area on the semiconductor substrate) from being increased in order to increase the film thickness of the side wall insulation film 19 or in order to increase the distance between the MTJ element 1 and the source line-side contact SLC.

Therefore, according to the magnetic memory of the embodiment, the reliability and manufacturing yield of the magnetic memory can be improved.

(b) Manufacturing Method

Referring to FIG. 7 to FIG. 11, a manufacturing method of the magnetic memory (e.g. MRAM) of the first embodiment is described. Also referring to FIG. 1 to FIG. 6, where necessary, the manufacturing method of the magnetic memory of this embodiment is described.

FIG. 7 to FIG. 11 are cross-sectional views taken along line V-V in FIG. 2, illustrating fabrication steps of a manufacturing method of the MRAM.

Figure 7:
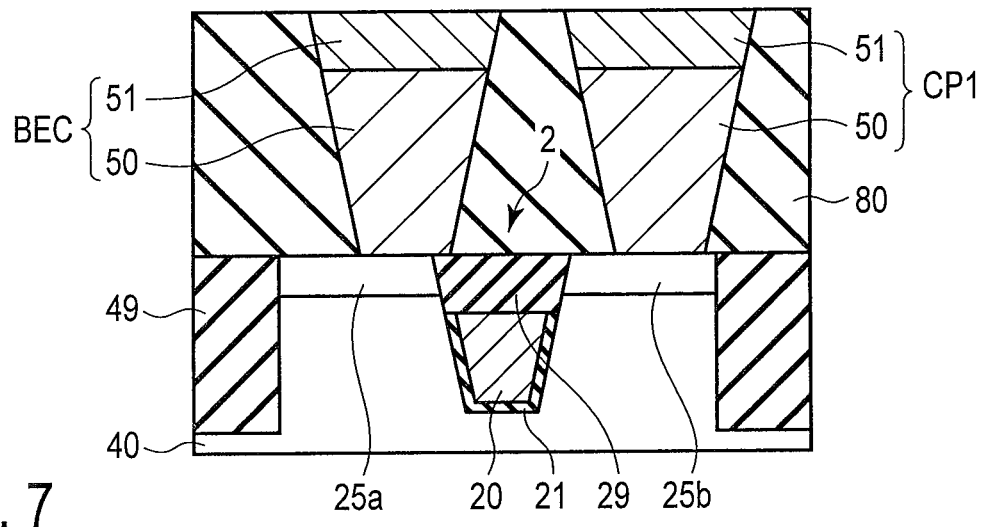
FIG. 7 is a cross-sectional view illustrating a fabrication step of a manufacturing method of the magnetic memory of the first embodiment.

FIG. 7 is a cross-sectional view illustrating a fabrication step of the manufacturing method of the MRAM of the embodiment.

As illustrated in FIG. 7, for example, a device isolation insulation film of an STI structure is formed in formation regions of a cell array and a peripheral/core circuit in a semiconductor substrate 40. Thereby, a device isolation region and an active area are formed in the semiconductor substrate. For example, an insulative material with a high burying characteristic, such as SiN, is used for the device isolation insulation layer.

Cell transistors in memory cells, and transistors of the peripheral/core circuit are formed on the semiconductor substrate 40.

For example, a cell transistor with a buried gate structure is formed in the following manner.

A recess extending in the Y direction is formed in the surface of the semiconductor substrate 40. A gate insulation film 21 is formed on an inner surface of a lower part of the recess.

A gate electrode 20 is formed on the inner surface of the gate insulation film 21 so as to fill the lower part of the recess.

An insulation layer 29 which is formed of, for example, SiN is formed on the upper surfaces of the gate insulation film 21 and the gate electrode 20, so as to fill the upper part of the recess. The insulation layer 29 is formed such that the upper surface of the insulation layer 29 may be substantially on a level with the upper surface of the semiconductor substrate 40.

A diffusion layer 25a, 25b, which functions as a source/drain of the cell transistor 2, is formed by ion implantation in the semiconductor substrate 40 in a self-alignment manner in relation to the gate electrode 20 which is buried in the semiconductor substrate 40.

In addition, the transistor with a planar structure in the peripheral/core circuit is formed in the following manner. A gate insulation film is formed on the surface of the semiconductor substrate by, for example, a thermal oxidation method. A polysilicon film is deposited on the gate insulation film by, for example, a CVD method. The polysilicon film is processed to have a predetermined shape by photolithography and etching, and a gate electrode of the transistor is formed. By a fabrication step which is performed substantially at the same time as the fabrication step of the transistor with the buried gate structure, a diffusion layer, which functions as a source/drain, is formed in the semiconductor substrate in a self-alignment manner in relation to the gate electrode on the surface of the semiconductor substrate.

Incidentally, the recess in the surface of the semiconductor substrate 40 may be formed by a sidewall transfer process technology so as to have a size (line width) which is smaller than a limit dimension of resolution by lithography. Thereby, a transistor having a gate size, which is less than the limit dimension of resolution of lithography, can be formed.

An interlayer insulation film (e.g. silicon oxide film) 80 is deposited by, e.g. CVD, on the semiconductor substrate 40 on which cell transistor 2 and peripheral transistor have been formed.

Contact holes are formed at positions corresponding to the source/drain diffusion layers 25a and 25b of the cell transistor 2 in the interlayer insulation film 80. The upper surface of the source/drain diffusion layer 25a, 25b of the cell transistor 2 is exposed. The contact hole has, for example, a tapered cross-sectional shape in accordance with the film thickness (the height of the contact hole) of the interlayer insulation film 80 and the opening dimension (diameter) of the contact hole.

Contact plugs BEC and CP1 are buried in the contact holes of the interlayer insulation film 80. The plugs BEC and CP1, which are formed of the same material, are connected to the source/drain diffusion layers 25a and 25b of the cell transistor 2. The contact plugs BEC and CP1 have tapered cross-sectional shapes in accordance with the shapes of the contact holes in the interlayer insulation film 80.

In the cell array 90, the plug BEC, CP1 buried in the interlayer insulation film 80 has a multilayer structure of a titanium nitride film (TiN film) 50 and a tantalum film (Ta film) 51.

For example, the titanium nitride film 50 of the plug BEC, CP1 is formed in the contact hole on the bottom side (semiconductor substrate side) of the contact hole such that the titanium nitride film 50 is put in direct contact with the source/drain diffusion layer 25a, 25b, by an atomic layer deposition (ALD) method, a chemical vapor deposition (CVD) method, or a sputtering method. Thereby, the titanium nitride film is filled in the contact hole. After a planarization process on the titanium nitride film by CMP, only the titanium nitride film 50 of the plug BEC, CP1 is selectively etched by, e.g. chemical dry etching (CDE), under the condition that the upper surface of the interlayer insulation film 80 is not etched. Thus, the upper surface of the titanium nitride film 50 is retreated by about 30 nm to 60 nm toward the semiconductor substrate side.

After a tantalum film is deposited on the interlayer insulation film 80 and titanium nitride film 50, a planarization process is performed on the tantalum film by CMP. Thereby, the plugs BEC and CP1 are formed in the interlayer insulation film 80 so that the upper surfaces of tantalum films 51 of the plugs BEC and CP1 may agree with the position of the upper surface of the interlayer insulation film 80.

As has been described above, in the present embodiment, the contact plug BEC on the MTJ element side and the lower plug CP1 of the source line-side contact SLC are formed in substantially the same fabrication step by using the same material.

For example, the contact plug CPa of the peripheral transistor 7 is formed in a fabrication step prior to the formation step of the contacts which are connected to the cell transistor.

Figure 8:
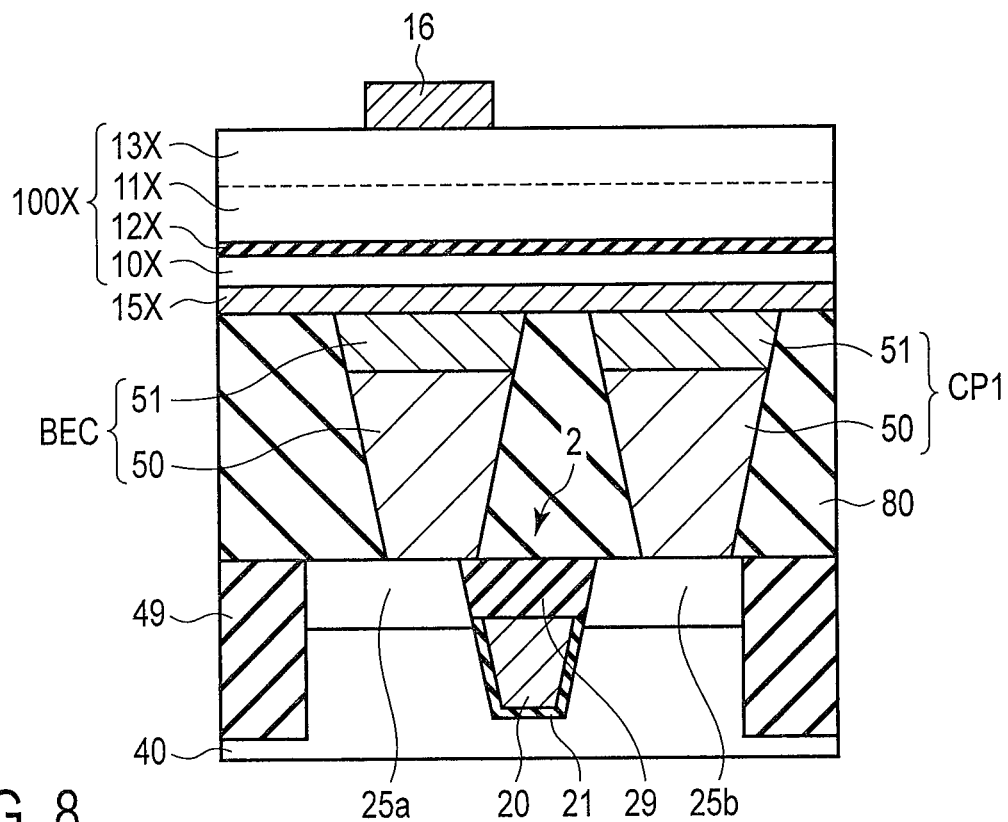
FIG. 8 is a cross-sectional view illustrating a fabrication step of the manufacturing method of the magnetic memory of the first embodiment.

FIG. 8 is a cross-sectional view illustrating a fabrication step of the manufacturing process of the MRAM of the embodiment.

As illustrated in FIG. 8, after the plug BEC on the MTJ element side and the lower plug CP1 of the source line-side contact are formed in the interlayer insulation film 80, members for forming a magnetoresistive effect element are successively deposited on the interlayer insulation film 80.

An electrically conductive layer 15X, which becomes a lower electrode of the magnetoresistive effect element, is deposited on the plugs BEC and CP1 and the interlayer insulation film 80 by, for example, sputtering.

A first magnetic layer 10X, a nonmagnetic layer 12X, a second magnetic layer 11X and a third magnetic layer 13X are successively deposited on the conductive layer 15X. For example, at least one selected from among CoFeB, CoPt and a ferrimagnetic material is used for the first to third magnetic layers (alloy films or artificial lattices) 10, 11 and 13. An insulative film (tunnel barrier film) consisting mainly of MgO is used for the nonmagnetic layer 12.

In order to make the magnetization reversal threshold of one of the two magnetic layers 10 and 11 greater than the magnetization reversal threshold of the other, the two magnetic layers 10 and 11 are deposited such that the film thickness of the one magnetic layer becomes greater than the film thickness of the other magnetic layer. Thereby, a reference layer and a memory layer of the magnetoresistive effect element are formed.

In this manner, a multilayer structure 100X for forming a magnetic tunnel junction is formed on the conductive layer (lower electrode) 15 on the interlayer insulation film 80.

A hard mask 16, which is formed of an electrically conductive layer 16, is formed on the magnetic layer 11 of the multilayer structure 100X. For example, a single layer film of at least one material selected from among tungsten (W), tantalum (Ta), titanium (Ti) and titanium nitride (TiN), or a multilayer formed of a combination of these materials, is used for the hard mask 16.

The hard mask 16 is patterned in a predetermined shape by, for example, lithography and etching. The plan-view shape of the patterned hard mask 16 corresponds to the plan-view shape of magnetic layers that are to be processed based on the hard mask 16 (or the plan-view shape of an MTJ element that is to be formed). For example, the plan-view shape of the patterned hard mask 16 is circular (or elliptic). The hard mask 16 has a columnar structure. In addition, as regards the patterned hard mask 16, the dimension (maximum dimension) of the hard mask 16 in a parallel direction to the surface of the semiconductor substrate is set in a range of, for example, about 10 nm to 40 nm.

The hard mask 16 is provided at a position overlapping the position of formation of the magnetoresistive effect element in a direction perpendicular to the surface of the semiconductor substrate 40. In the example illustrated in FIG. 8, the hard mask 16 is formed above the contact plug BEC in the perpendicular direction to the surface of the semiconductor substrate 40.

Figure 9:
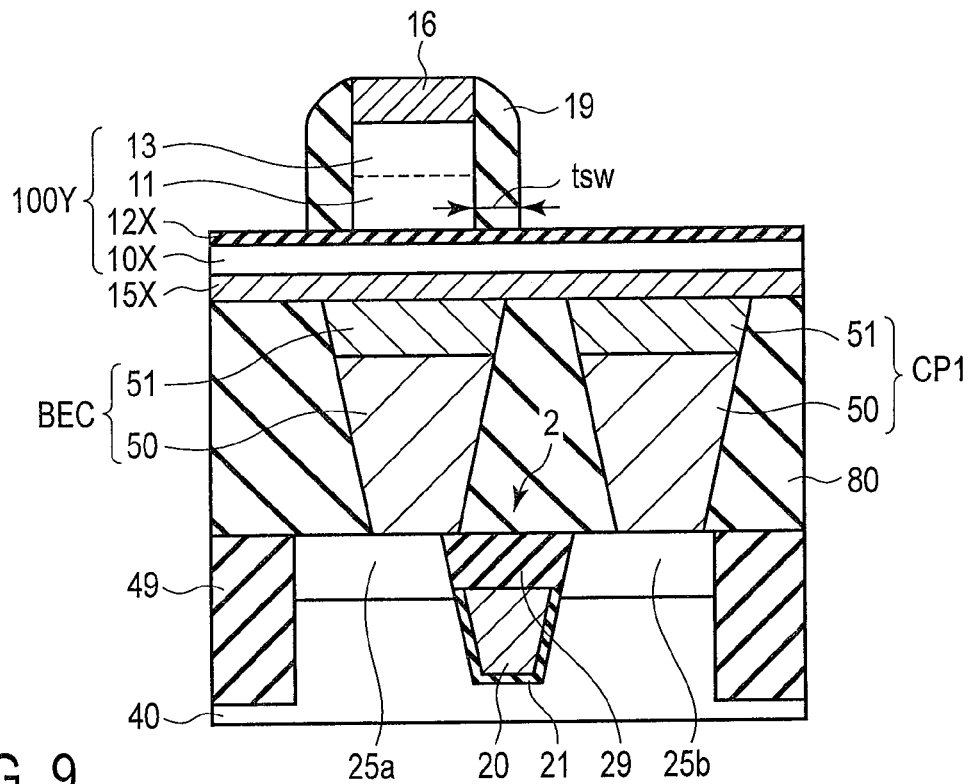
FIG. 9 is a cross-sectional view illustrating a fabrication step of the manufacturing method of the magnetic memory of the first embodiment.

FIG. 9 is a cross-sectional view illustrating a fabrication step of the manufacturing process of the MRAM of the embodiment.

As illustrated in FIG. 9, etching is performed for forming the magnetoresistive effect element (MTJ element) by using the hard mask 16 as a mask.

Ion milling is used for the etching for forming the magnetoresistive effect element.

When the multilayer structure 100Y is processed by ion milling, the magnetic layers 11 and 13 on the nonmagnetic layer 12X are etched so as to have a pattern corresponding to the shape of the hard mask 16, by using the nonmagnetic layer 12X as a stopper. Thereby, a reference layer 11 and a shift control layer 13 are formed on the nonmagnetic layer 12X.

Then, prior to processing the nonmagnetic layer 12 and the members 10X and 15X under the nonmagnetic layer 12, for example, a side wall insulation film 19 is deposited on the side surfaces of the processed magnetic layers 10 and 13 by using ALD or CVD. At least one selected from among a silicon nitride film, a silicon oxide film and an aluminum oxide (alumina) film is used for the side wall insulation film 19. The side wall insulation film 19 is formed such that a film thickness tsw of the side wall insulation film 19 in the parallel direction to the surface of the semiconductor substrate is, for example, about 6 nm to 12 nm.

It is preferable that a conformal film be formed as the side wall insulation film 19, in order to protect the MTJ element 1.

In the meantime, when the magnetic layers 11 and 13 on the nonmagnetic layer 12 are processed, an ion beam for the ion milling may be radiated on the hard mask 16 and multilayer structure 100 in an oblique direction to the surface of the semiconductor substrate, while the semiconductor substrate is being rotated, or the ion beam may be radiated on the hard mask 16 and multilayer structure 100 in a perpendicular direction to the surface of the semiconductor substrate.

Figure 10:
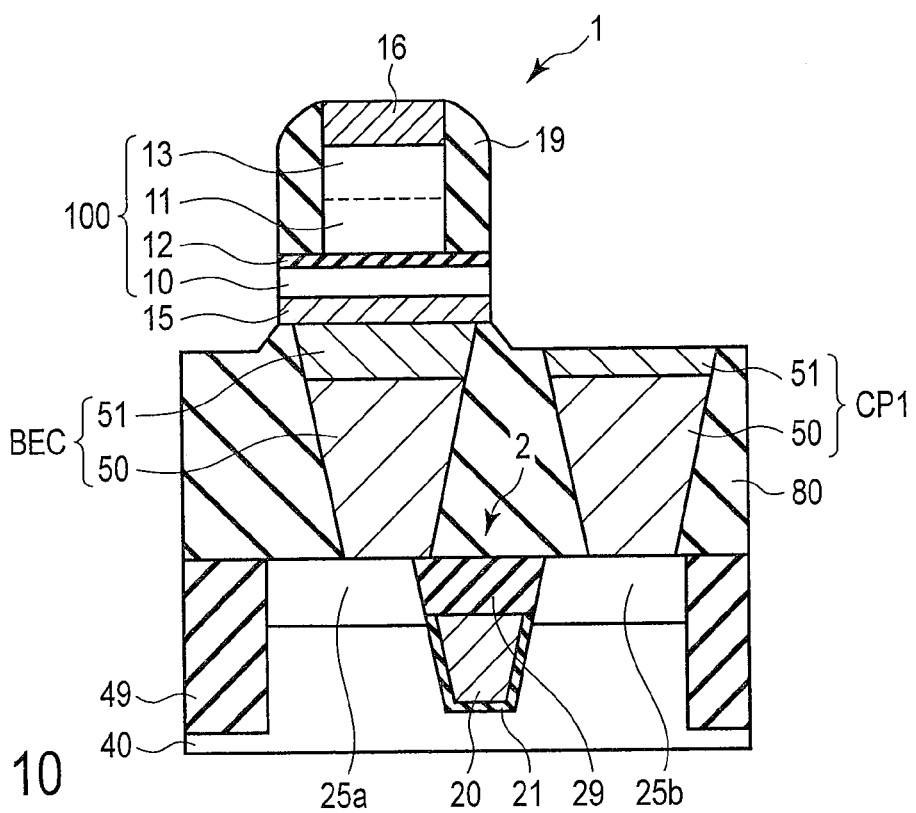
FIG. 10 is a cross-sectional view illustrating a fabrication step of the manufacturing method of the magnetic memory of the first embodiment.

FIG. 10 is a cross-sectional view illustrating a fabrication step of the manufacturing process of the MRAM of the embodiment.

As illustrated in FIG. 10, in the state in which the side surfaces of the reference layer 10 and shift control layer 13 are covered with the side wall insulation film 19, the nonmagnetic layer 12, magnetic layer 10 and conductive layer 15 are successively etched by ion milling. Thereby, with the hard mask 16 and side wall insulation film 19 being used as a mask, the nonmagnetic layer 12 and the members 10 and 15 thereunder are processed, and a tunnel barrier layer 12, a memory layer 10 and a lower electrode 15 of the MTJ element 1 are formed.

Thereby, the MTJ element 1 is formed on the interlayer insulation film 80 and plug BEC. In the meantime, in the embodiment, the MTJ element with a top pin structure is formed. However, an MTJ element with a bottom pin structure may be formed. In this case, after the processing of the memory layer is performed, the processing of the reference layer is performed.

When the nonmagnetic layer 12 and the members 10 and 15 thereunder are processed, the side wall insulation film 19 on the side surface of the reference layer 10 functions as a mask, in addition to the hard mask 16. Thus, the dimension of the memory layer 10 and nonmagnetic layer 12 in the parallel direction to the surface of the semiconductor substrate 40 becomes greater than the dimension of the reference layer 11 (and shift control layer 13) in the parallel direction to the surface of the semiconductor substrate 40.

When the nonmagnetic layer 12 and the members 10 and 15 thereunder are processed, the side surface of the reference layer 10 is covered with the side wall insulation film 19. The side wall insulation film 19 prevents conductive flying matter, which occurs due to the etching on the conductors (magnetic layer, lower electrode) under the nonmagnetic layer 12, from directly adhering to the side surface of the reference layer 11. As a result, it is possible to prevent the occurrence of short-circuit between the reference layer 11 and the memory layer 10 by the conductive flying matter flying over the tunnel barrier layer 12 and adhering to the side surface of the reference layer 11 and the side surface of the memory layer 10.

At the time of etching on the MTJ element 1, the multilayer structure 100 is over-etched in order to secure a processing margin, and thereby the upper surfaces of the interlayer insulation film 80 and plug CP1 are etched.

Thus, the upper surface of the plug CP1 on the side where the MTJ element 1 is not provided, that is, the upper surface of the lower plug CP1 of the source line-side contact, is etched, and the position of the upper surface of the lower plug CP1 retreats to the semiconductor substrate 40 side.

With the lower plug CP1 being etched, the height (the dimension in the perpendicular direction to the surface of the semiconductor substrate) of the lower plug CP1 becomes less than the height of the plug BEC under the MTJ element 1. Since the Ta film 51 on the TiN film 50 is etched, the film thickness of the upper-side Ta film 51 of the lower plug CP1 becomes less than the film thickness of the Ta film 51 of the plug BEC under the MTJ element 1.

For example, the upper surface of the interlayer insulation film 80 in the vicinity of the lower plug CP1 of the source line-side contact SLC retreats to the semiconductor substrate 40 side, compared to the upper surface of the interlayer insulation film in the vicinity of the MTJ element 1.

With the upper surface of the interlayer insulation film 80 being etched, a conductive residue on the upper surface of the interlayer insulation film 80 at the time of formation of the plug BEC, CP1 is removed. Thereby, it is possible to prevent short-circuit between the bit line-side plug BEC and the source line-side plug CP1 due to the conductive residue.

Figure 11:
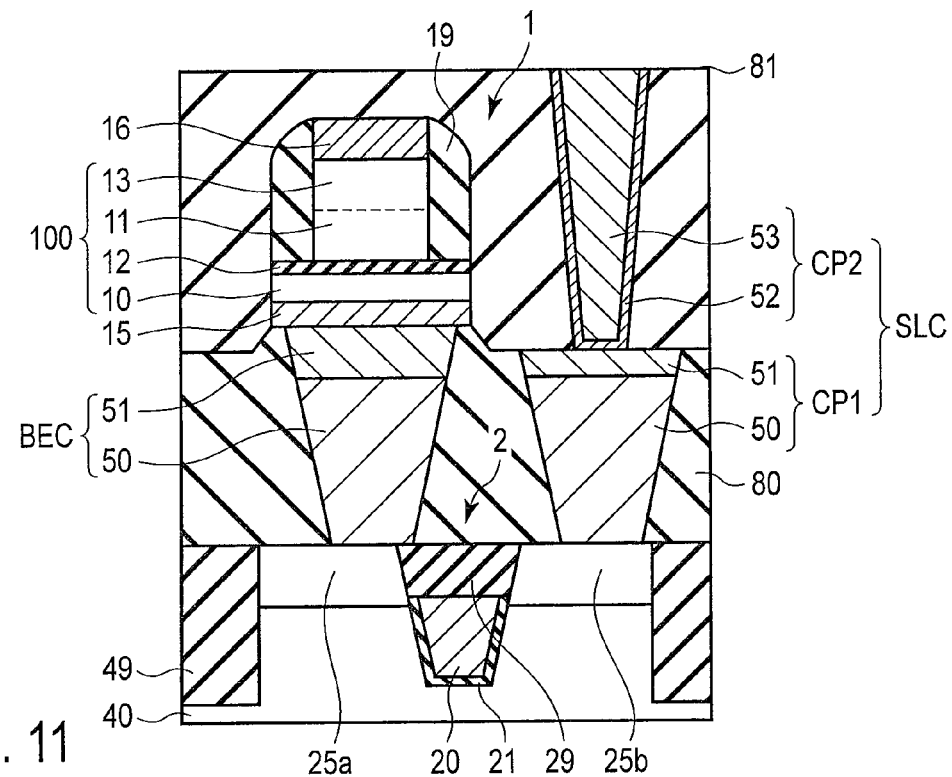
FIG. 11 is a cross-sectional view illustrating a fabrication step of the manufacturing method of the magnetic memory of the first embodiment.

FIG. 11 is a cross-sectional view illustrating a fabrication step of the manufacturing process of the MRAM of the embodiment.

As illustrated in FIG. 11, after a side wall insulation film (not shown), which is formed of, for example, an SiN film, is deposited on the side surface of the MTJ element 1, a second interlayer insulation film 81 is formed on the interlayer insulation film 80 by, for example, CVD, so as to cover the MTJ element 1.

Thereafter, as shown in FIG. 5, a plug TEC having a multilayer structure of a titanium nitride film 58 and a tungsten film 59 is buried in a contact hole formed in the interlayer insulation film 81, so that the plug TEC is connected to the upper electrode 16 of the MTJ element 1.

For example, after the upper surface of the interlayer insulation film 81 is planarized, the plug TEC on the MTJ element 1 is formed by lithography and etching. In the formation step of the plug TEC, a multilayer of a titanium nitride film and a titanium film is formed in the contact hole by CVD at temperatures of 300° C. or below. A planarization process by CMP is performed on the formed titanium nitride film and titanium film.

After the planarization process on the upper surfaces of the interlayer insulation film 81 and via-plug TEC, a contact hole is formed in the interlayer insulation film 81 by, for example, lithography and etching, at the position of formation of the source line-side contact SLC, so that the upper surface of the lower plug CP1 of the source line-side contact SLC is exposed. For example, the contact hole is formed above the lower plug CP1 so that the opening dimension (e.g. diameter) of the upper side of the contact hole in the interlayer insulation film 81 may become smaller than the dimension (e.g. diameter) of the upper side of the lower plug CP1 in the parallel direction to the surface of the semiconductor substrate. For example, the height of the contact hole in the interlayer insulation film 81 is less than the height of the lower plug CP1.

The contact hole formed in the interlayer insulation film 81 has, for example, a tapered cross-sectional shape, and the opening dimension of the contact hole is less than the dimension of the bottom part of the contact hole. For example, the aspect ratio of the contact hole, in which the upper-side plug of the source line-side contact is buried, is, for example, about 3 to 5.

The upper plug CP2 of the source line-side contact SLC is buried in the formed contact hole such that the upper plug CP2 is in contact with the lower plug CP1.

The upper plug CP2 of the source line-side contact SLC is formed of a material which is different from the material of the lower plug CP1 of the source line-side contact SLC. For example, the upper plug CP2 includes a multilayer structure of a titanium nitride film 52 and a tungsten film 53. In this case, after the titanium nitride film 52, which functions as a barrier metal, is formed in the contact hole in the interlayer insulation film 81, the tungsten film 53 is deposited on the titanium nitride film 52 so as to fill the contact hole.

For example, a via-plug CPb of the peripheral transistor 7 is formed in a fabrication step after the via-plug on the MTJ element and the upper plug of the source line-side contact are formed.

In the meantime, the upper plug CP2 of the source line-side contact SLC and the plug of the peripheral transistor 7 may be formed of the same material. In this case, the upper plug CP2 of the source line-side contact SLC may be formed at the same time as the contact plug CPb in the interlayer insulation film 81 in the peripheral transistor 7 shown in FIG. 6.

It is preferable that the formation step (e.g. deposition of material) of the plugs TEC, CPb and CP2, which is performed after the formation of the MTJ element, be performed at temperatures of 300° C. or below, so as not to deteriorate various characteristics of the MTJ element 1.

In this manner, the source line-side contact SLC of the two-stage structure including the two plugs CP1 and CP2 is formed in the interlayer insulation films 80 and 81 of the multilayer structure.

In the meantime, the upper plug CP2 in the interlayer insulation film 81 has a shape corresponding to the shape of the contact hole that is formed in the interlayer insulation film 81. Specifically, the upper plug CP2 of the source line-side contact SLC has a tapered cross-sectional shape.

The dimension of the upper part of the upper plug CP2 in the parallel direction to the surface of the semiconductor substrate 40 is greater than the dimension of the bottom part of the upper plug CP2 in the parallel direction to the surface of the semiconductor substrate 40. As regards the two plugs CP1 and CP2 of the source line-side contact SLC, the dimension of the upper plug CP2 in the parallel direction to the surface of the semiconductor substrate is less than the dimension of the upper side of the lower plug CP1 in the parallel direction to the surface of the semiconductor substrate. In addition, the height of the upper plug CP2 is less than the height of the lower plug CP1.

Wirings 55a, 55b, which are formed of metal films of, e.g. copper (Cu), are formed on the via-plug TEC and the upper plug CP2 of the source line-side contact SLC. Thereby, a bit line BL which is connected to the plug TEC of the MTJ element 1, and a source line (bit line) SL (bBL), which is connected to the source line-side contact SLC, are formed.

Thereafter, wirings and interlayer insulation films are successively formed in the cell array and core/peripheral circuit areas by multilayer wiring technology.

Through the above-described fabrication steps, the MRAM (magnetic memory) of the embodiment is formed.

In the manufacturing method of the MRAM of the embodiment, the contact plug SLC, which is connected to the source line (the bit line that is set on the low potential side at a time of data read) of the memory cell, is formed in two separate fabrication steps. The source line-side contact plug SLC is formed of the multilayer structure of two plugs CP1 and CP2.

Thereby, according to the present embodiment, it is possible to decrease the aspect ratio of each contact plug on the source line side of the memory cell and each contact hole for forming each contact plug, compared to the case where a single contact hole and contact plug, which penetrate a plurality of interlayer insulation films, are formed in the plural interlayer insulation films such that the surface of the semiconductor substrate 40 is exposed.

Therefore, in the embodiment, it is possible to suppress an increase in the dimension (width) of the source line-side contact SLC in the parallel direction to the surface of the semiconductor substrate, and to increase the distance between the MTJ element 1 and that part (upper plug) CP2 of the contact plug SLC, which neighbors the MTJ element 1.

As a result, according to the embodiment, the film thickness of the side wall insulation film 19 on the side surface of the MTJ element 1 can be increased.

In the embodiment, the side wall insulation film 19 with a large film thickness can be formed on the side surface of the MTJ element 1. Thereby, even if electrically conductive flying matter, which has occurred due to the processing of a conductive layer (e.g. magnetic layer or lower electrode), adheres on the side surface of the MTJ element 1 as adhering matter, it is possible to prevent the occurrence of short-circuit between the lower electrode 15 and upper electrode 16 due to the adhering matter.

In addition, according to the embodiment, a large distance can be secured between the source line-side contact SLC (upper plug CP2) and the MTJ element 1. Thus, in the case where the side wall insulation film 19 with a large film thickness is formed on the side surface of the MTJ element 1, as described above, even if a conductive residue has adhered on the side wall insulation film 19, it is possible to prevent short-circuit between the MTJ element and the source line-side contact SLC due to the conductive residue on the side wall insulation film 19.

According to the manufacturing method of the MRAM of the embodiment, the film thickness of the side wall insulation film 19 can be increased without increasing the size (the area on the semiconductor substrate) of the memory cell, and the distance between the MTJ element 1 and the source line-side contact SLC can be increased.

Therefore, according to the manufacturing method of the magnetic memory of the embodiment, the reliability and manufacturing yield of the magnetic memory can be improved.

(2) Second Embodiment

Figure 12:
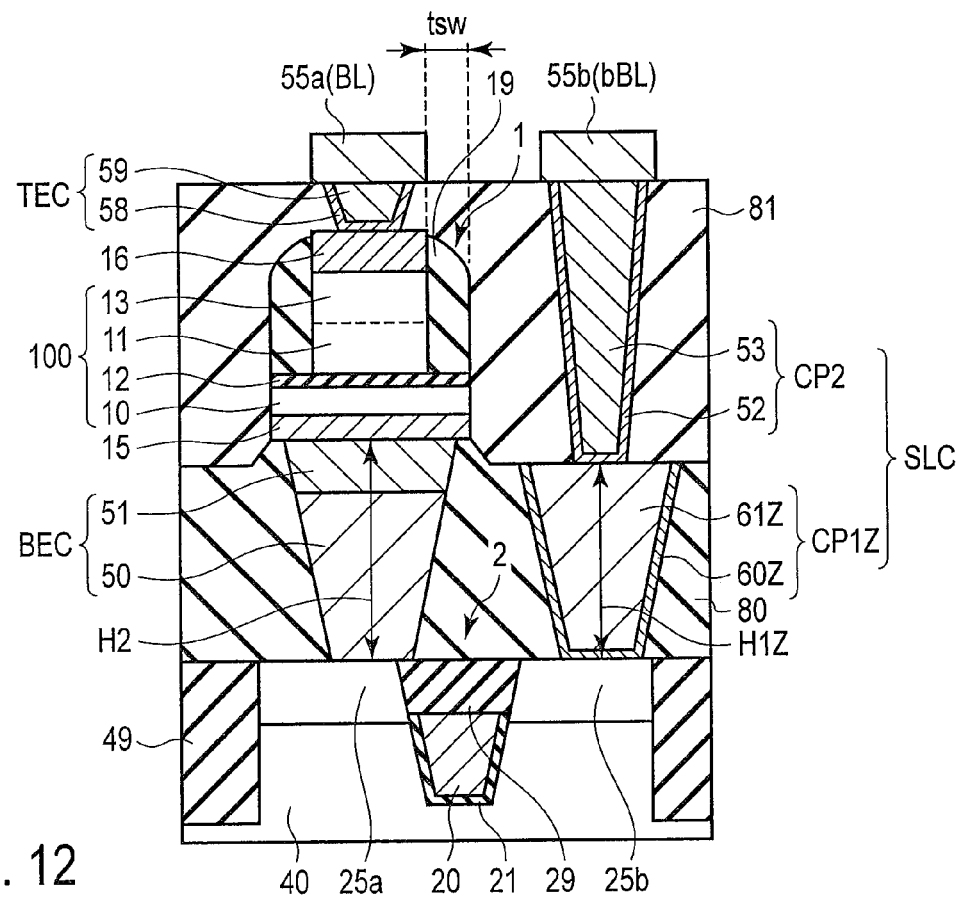
FIG. 12 is a view illustrating a structure example of a memory cell of a magnetic memory according to a second embodiment.

Referring to FIG. 12 and FIG. 13, a description is given of a structure and a manufacturing method of a magnetic memory (e.g. MRAM) according to a second embodiment. In the second embodiment, the same structural parts as those in the first embodiment are denoted by like reference numerals, and a description thereof is omitted.

FIG. 12 is a view which schematically illustrates a cross-sectional structure of a memory cell of the MRAM of the second embodiment.

As illustrated in FIG. 12, the MRAM of this embodiment differs from the MRAM of the first embodiment in that, in the source line-side contact SLC including two plugs CP1Z and CP2, the material (structure) of the lower plug CP1Z on the semiconductor substrate 40 side is different from the material (structure) of the contact plug BEC under the MTJ element 1.

For example, the same material as the material of the contact plug CPa of the peripheral transistor 7 of FIG. 6 is used for the material of the lower plug CP1Z of the source line-side contact SLC. In this case, the lower plug CP1Z includes a tungsten film (tungsten plug) 61z which is buried in a contact hole of the interlayer insulation film, and a titanium nitride film 60z which functions as a barrier metal between the tungsten film 61z and the interlayer insulation film. The titanium nitride film 60z of the lower plug CP1Z is put in direct contact with the source/drain diffusion layer 25b of the transistor 2, and the tungsten film 61z is put in direct contact with the upper plug CP2. Incidentally, a titanium film may be substituted for the tungsten film 61z.

For example, the aspect ratio of the lower plug CP1Z of the source line-side contact SLC is different from the aspect ratio of the contact plug BEC of the bit line-side contact. For instance, the aspect ratio of the lower plug CP1Z is about 6 to 10, and the aspect ratio of the contact plug BEC is about 5 to 7. For example, the dimension of the bottom side of the lower plug CP1Z in the parallel direction to the surface of the semiconductor substrate 40 is less than the dimension of the bottom side of the contact plug BEC in the parallel direction to the surface of the semiconductor substrate 40. In addition, the dimension of the upper side of the lower plug CP1Z in the parallel direction to the surface of the semiconductor substrate 40 is less than the dimension of the upper side of the contact plug BEC in the parallel direction to the surface of the semiconductor substrate 40.

FIG. 13 is a cross-sectional view illustrating a fabrication step of the manufacturing method of the MRAM of the present embodiment.

As illustrated in FIG. 13, after the cell transistor 2 and peripheral transistor 7 are formed on the semiconductor substrate 40, an interlayer insulation film 80 is formed on the semiconductor substrate 40.

For example, by the same fabrication step as shown in FIG. 7, the bit line-side contact plug BEC of the memory cell is formed in the interlayer insulation film 80.

In a fabrication step which is different from the fabrication step of the contact plug BEC on the bit line side of the memory cell, a contact hole for burying a contact plug (lower plug) on the source line side is formed in the interlayer insulation film 80. A material different from the material of the contact plug BEC is buried in the contact hole in the interlayer insulation film 80 so as to come in contact with the source/drain diffusion layer 25b. Thereby, the lower plug CP1Z of the source line-side contact SLC is formed in the interlayer insulation film 80.

For example, when the lower plug CP1Z of the source line-side contact SLC is formed of the same material (titanium nitride and tungsten films) as the contact plug of the peripheral transistor 7 shown in FIG. 6, the lower plug CP1Z is formed at substantially the same time as the contact plug CPa of the peripheral transistor 7 in the common fabrication step.

After the lower plug CP1Z of the source line-side contact is formed, as illustrated in FIG. 8, the structural member 100X of the MTJ element 1 and the hard mask 16 are deposited on the interlayer insulation film 80 and the plugs BEC and CP1Z.

Thereafter, by substantially the same fabrication steps as the steps illustrated in FIG. 9 to FIG. 11, the MTJ element, the upper plug CP2 of the source line-side contact SLC and the bit lines BL and bBL (SL) are successively formed.

In the meantime, when the lower plug CP1Z of the source line-side contact SLC is formed at the same time as the contact plug CPa of the peripheral transistor 7 by using the same material, the lower plug CP1Z may be formed in the interlayer insulation film 80 in a fabrication step prior to the formation of the contact plug (bit line-side contact) BEC under the MTJ element 1, or may be formed in the interlayer insulation film 80 in a fabrication step after the formation of the contact plug BEC.

As has been described above, in accordance with the layout of the memory cell in the cell array 90, the structure of the memory cell or the manufacturing process, the lower plug CP1Z of the source line-side contact SLC includes the material and structure which are different from those of the contact plug BEC under the MTJ element 1, as in the MRAM of the present embodiment.

In the present embodiment, too, the source line-side contact SLC in the memory cell MC includes the two-stage structure including the two plugs CP1Z and CP2. Therefore, compared to the case where a single contact plug, which penetrate a plurality of interlayer insulation films, connects the source line to the source/drain diffusion region of the cell transistor, the MRAM of this embodiment can reduce the aspect ratio of each contact plug CP1Z, CP2 in the source line-side contact SLC. As a result, in the MRAM of this embodiment, the distance between the source line-side contact SLC and the MTJ element 1 in the parallel direction to the surface of the semiconductor substrate 40 can be increased, and the film thickness of the side wall insulation film 19 on the side surface of the MTJ element 1 can be increased.

Therefore, according to the magnetic memory of the second embodiment, the reliability and manufacturing yield of the magnetic memory can be improved.

(3) Third Embodiment

Referring to FIG. 14 and FIG. 15, a description is given of a structure and a manufacturing method of a modification of the magnetic memory (e.g. MRAM) of the embodiment. In this modification, the same structural parts as those in the first and second embodiments are denoted by like reference numerals, and a description thereof is omitted.

FIG. 14 is a view which schematically illustrates a cross-sectional structure of a memory cell of the MRAM of the third embodiment.

This embodiment differs from the first and second embodiments with respect to the structure and manufacturing method of the MTJ element.

As illustrated in FIG. 14, in an MTJ element 1A of the MRAM of this embodiment, the dimension of a tunnel barrier layer 12A in the parallel direction to the surface of the substrate is substantially equal to or greater than the dimension of a reference layer 10 in the parallel direction to the surface of the substrate. In addition, there is a case in which the dimension of the memory layer in the parallel direction to the surface of the substrate is substantially equal to the dimension of the reference layer 10.

Besides, a lower electrode 15A has a convex cross-sectional shape. That part of the upper surface of the lower electrode 15A, which is located under the side wall insulation film 19, retreats more on the semiconductor substrate side than that part of the lower electrode 15A, which is located under the magnetic layer 10A. Thus, the film thickness of that part of the lower electrode 15A, which is located under the side wall insulation film 19, is less than the film thickness of that part of the lower electrode 15A, which is located under the magnetic layer 10A.

A multilayer structure including the memory layer, tunnel barrier layer and reference layer in the MTJ element 1A has a rectangular cross-sectional shape. Incidentally, the MTJ element 1A may have a tapered cross-sectional shape. In an MTJ element with a tapered cross-sectional shape, the dimension of the lower side of the MTJ element in the parallel direction to the surface of the semiconductor substrate is greater than the dimension of the upper side of the MTJ element.

The MTJ element in the MRAM of this embodiment is formed in the following manner.

FIG. 15 is a cross-sectional view illustrating a fabrication step of the manufacturing method of the MRAM of the third embodiment.

As illustrated in FIG. 15, after the fabrication step shown in FIG. 8, unlike the fabrication step shown in FIG. 9, parts of the magnetic layers 13 and 11, nonmagnetic layer 12A, magnetic layer 10A and conductive layer 15Z are etched by ion milling by using the hard mask 16, without using the nonmagnetic layer as a stopper.

Then, a side wall insulation film 19 is deposited on the processed multilayer structure 100Z.

Thereafter, using the side wall insulation film 19 as a mask, the other part of the conductive layer 15Z is processed.

Thereby, the dimension of the tunnel barrier layer 12A of the MTJ element 1A becomes substantially equal to or greater than the dimension of the reference layer 11 (and shift control layer 13).

In the meantime, in order to suppress short-circuit between the magnetic layer (reference layer) 11 and magnetic layer (memory layer) 10A, an oxidizing process may be executed on the magnetic layers 10, 11 and 13 and conductive adhering matter on the side surfaces of the magnetic layers 10, 11 and 13, after the magnetic layers 13 and 11, nonmagnetic layer 12 and a part of the magnetic layer 10X are processed based on the hard mask 16.

After the conductive layer (lower electrode) 15Z is processed, the upper plug CP2 of the source line-side contact SLC and the bit lines BL and bBL (SL) are successively formed by substantially the same fabrication steps as the steps illustrated in FIG. 9 to FIG. 11.

In the present embodiment, too, the source line-side contact SLC in the memory cell MC includes the two-stage structure including the two plugs CP1 and CP2. Therefore, in the MRAM of this embodiment, like the first and second embodiments, the aspect ratio of each plug CP1, CP2 in the source line-side contact SLC can be decreased. As a result, according to this embodiment, the distance between the source line-side contact SLC and the MTJ element 1 can be increased, and the film thickness of the side wall insulation film 19 on the side surface of the MTJ element 1 can be increased.

Therefore, according to the magnetic memory of the second embodiment, the reliability and manufacturing yield of the magnetic memory can be improved.

Others

The structure of the source line-side contact including the two plugs in this embodiment is not limited to the magnetic memory, and may be applicable to a resistive memory in which a resistive element formed of a metal oxide or the like is used for a memory element, or a phase change memory in which a phase change element formed of chalcogenide or the like is used for a memory element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a cell transistor on a semiconductor substrate, the cell transistor including a first source/drain diffusion layer, a second source/drain diffusion layer, a first gate insulation film on a channel region between the first source/drain diffusion layer and the second source/drain diffusion layer, and a first gate electrode on the first gate insulation film;
   a first contact on the first source/drain diffusion layer of the cell transistor;
   a magnetoresistive effect element as a memory element, on the first contact;
   a second contact on the second source/drain diffusion layer of the cell transistor, the second contact including a first plug on the second source/drain diffusion layer, and a second plug on the first plug, the second plug neighboring the memory element;
   a first bit line above the magnetoresistive effect element as the memory element; and
   a second bit line above the second contact;
   wherein the first contact includes a first titanium nitride film on the first source/drain diffusion layer, and a first tantalum film on the first titanium nitride film; and
   wherein the first plug includes a first tungsten film buried in an interlayer insulation film on the semiconductor substrate, and a second titanium nitride film between the interlayer insulation film and the first tungsten film.

2. The magnetic memory according to claim 1, wherein the magnetoresistive effect element includes a side wall insulation film on a side surface of the magnetoresistive effect element.

3. The magnetic memory according to claim 1, wherein an upper surface of the first plug is located more on the semiconductor substrate side than an upper surface of the first contact.

4. The magnetic memory according to claim 1, wherein a maximum dimension of the second plug in a direction parallel to a surface of the semiconductor substrate is less than a maximum dimension of the first plug in the direction parallel to the surface of the semiconductor substrate.

5. The magnetic memory according to claim 1, wherein an aspect ratio of the second plug is less than an aspect ratio of the first plug.

6. The magnetic memory according to claim 1, wherein a material of the first plug is the same as a material of the first contact.

7. The magnetic memory according to claim 1, wherein a material of the first plug is different from a material of the first contact.

8. The magnetic memory according to claim 7, further comprising:

a first transistor on the semiconductor substrate, the first transistor including a third source/drain diffusion layer, a fourth source/drain diffusion layer, a second gate insulation film on a channel region between the third source/drain diffusion layer and the fourth source/drain diffusion layer, and a second gate electrode on the second gate insulation film; and a third contact on the second source/drain diffusion layer of the first transistor, wherein a material of the third contact is different from the material of the first contact and is the same as the material of the first plug.

9. A manufacturing method of a magnetic memory, the method comprising:

forming a cell transistor on a semiconductor substrate, the cell transistor including a first source/drain diffusion layer, a second source/drain diffusion layer, a first gate insulation film on a channel region between the first source/drain diffusion layer and the second source/drain diffusion layer, and a first gate electrode on the first gate insulation film;

forming a first contact on the first source/drain diffusion layer, and forming a first plug on the second source/drain diffusion layer;

forming a magnetoresistive effect element as a memory element, on the first contact;

forming a second plug on the first plug to form a second contact including the first plug and the second plug; and forming a first bit line above the magnetoresistive effect element, and forming a second bit line above the second plug;

wherein a material of the first plug is the same as a material of the first contact;

wherein the first contact includes a first titanium nitride film on the first source/drain diffusion layer, and a first tantalum film on the first titanium nitride film;

wherein the first plug includes a second titanium nitride film on the second source/drain diffusion layer, and a second tantalum film on the second titanium nitride film; and wherein a film thickness of the second tantalum film is less than a film thickness of the first tantalum film.

10. The manufacturing method of the magnetic memory according to claim 9, further comprising forming a side wall insulation film on a side surface of the magnetoresistive effect element, after forming the magnetoresistive effect element and before forming the second plug.

11. The manufacturing method of the magnetic memory according to claim 9, wherein when the magnetoresistive effect element is formed, an upper surface of the first plug and an upper surface of a first interlayer insulation film in which the first contact and the first plug are buried are etched, and the upper surface of the first plug and the upper surface of the first interlayer insulation film retreat to the semiconductor substrate side.

12. The manufacturing method of the magnetic memory according to claim 9, wherein the first contact and the first plug are formed at the same time.

13. The manufacturing method of the magnetic memory according to claim 9, wherein the first contact and the first plug are formed at different timings.

14. The manufacturing method of the magnetic memory according to claim 9, wherein a material of the first plug is different from a material of the first contact.

15. The manufacturing method of the magnetic memory according to claim 9, further comprising:

forming a first transistor on the semiconductor substrate, the first transistor including a first source/drain diffusion layer, a second source/drain diffusion layer, a second gate insulation film on a channel region between the first source/drain diffusion layer and the second source/drain diffusion layer, and a second gate electrode on the second gate insulation film; and forming a third contact on the third source/drain diffusion layer, wherein a material of the third contact is different from a material of the first contact and is the same as a material of the first plug.

* * * * *